US012658871B2

(12) United States Patent
Breitschaedel et al.

(10) Patent No.: US 12,658,871 B2
(45) Date of Patent: Jun. 16, 2026

(54) METHOD AND SYSTEM FOR AUDIO COMPRESSION FOR CONTEXTUAL VOLUME CONTROL

(71) Applicant: Apple Inc., Cupertino, CA (US)

(72) Inventors: Hannes Breitschaedel, Vienna (AT); Tony S. Verma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 213 days.

(21) Appl. No.: 18/544,243

(22) Filed: Dec. 18, 2023

(65) Prior Publication Data

US 2024/0364289 A1      Oct. 31, 2024

Related U.S. Application Data

(60) Provisional application No. 63/499,194, filed on Apr. 28, 2023.

(51) Int. Cl.
*H03G 3/32* (2006.01)
*H04R 1/10* (2006.01)

(52) U.S. Cl.
CPC ............. *H03G 3/32* (2013.01); *H04R 1/1041* (2013.01); *H04R 2430/01* (2013.01)

(58) Field of Classification Search
CPC ......... H04F 1/1041; H03G 3/24; H03G 3/32; H04R 2430/01
USPC ............................... 381/56–59, 104–109, 74
See application file for complete search history.

(56) References Cited

U.S. PATENT DOCUMENTS

| | | | |
|---|---|---|---|
| 7,706,821 B2 * | 4/2010 | Konchitsky | ......... H04M 1/6066 455/114.2 |
| 8,457,321 B2 * | 6/2013 | Daubigny | ................ H03G 3/02 381/28 |
| 10,103,702 B2 | 10/2018 | Putta et al. | |
| 10,355,658 B1 | 7/2019 | Yang | |
| 11,660,530 B2 * | 5/2023 | Kuruba Buchannagari | ................ A63F 13/25 381/104 |
| 11,894,006 B2 * | 2/2024 | Wang | .................... G10L 19/265 |
| 11,907,611 B2 * | 2/2024 | Baumgarte | ............. G06F 3/165 |
| 11,955,107 B2 * | 4/2024 | Trivedi | .................... H03G 3/32 |

(Continued)

FOREIGN PATENT DOCUMENTS

CN          112104950 A      12/2020

OTHER PUBLICATIONS

Sony, "LinkBuds Truly Wireless Earbuds" received from https://electronics.sony.com/audio/headphones/truly-wireless-earbuds/p/wf1900-h, 2022, 9 pages.

*Primary Examiner* — Disler Paul
(74) *Attorney, Agent, or Firm* — Aikin & Gallant, LLP

(57) ABSTRACT

A method that includes receiving audio content; receiving a volume level at which the audio content is to be played back through a speaker of the headset that is worn by a user; determining a noise level of environmental noise at the headset; determining a noise exposure level by the user based on the volume level, a content level of the audio content, and the noise level; determining whether a content level of the audio content is less than a threshold that is based on the noise exposure level; and responsive to determining that the content level is less than the threshold, adjusting the content level by applying a gain to the audio content such that the gain-adjusted content level of the audio content is at least equal to the noise exposure level.

20 Claims, 14 Drawing Sheets

(56) References Cited

U.S. PATENT DOCUMENTS

| | | | |
|---|---|---|---|
| 2010/0166225 A1* | 7/2010 | Watanabe | H03G 3/32 |
| | | | 381/107 |
| 2012/0177210 A1 | 7/2012 | Goldstein et al. | |
| 2014/0247948 A1 | 9/2014 | Goldstein | |
| 2016/0249145 A1 | 8/2016 | Ohl et al. | |
| 2020/0394015 A1 | 12/2020 | Usher et al. | |

* cited by examiner

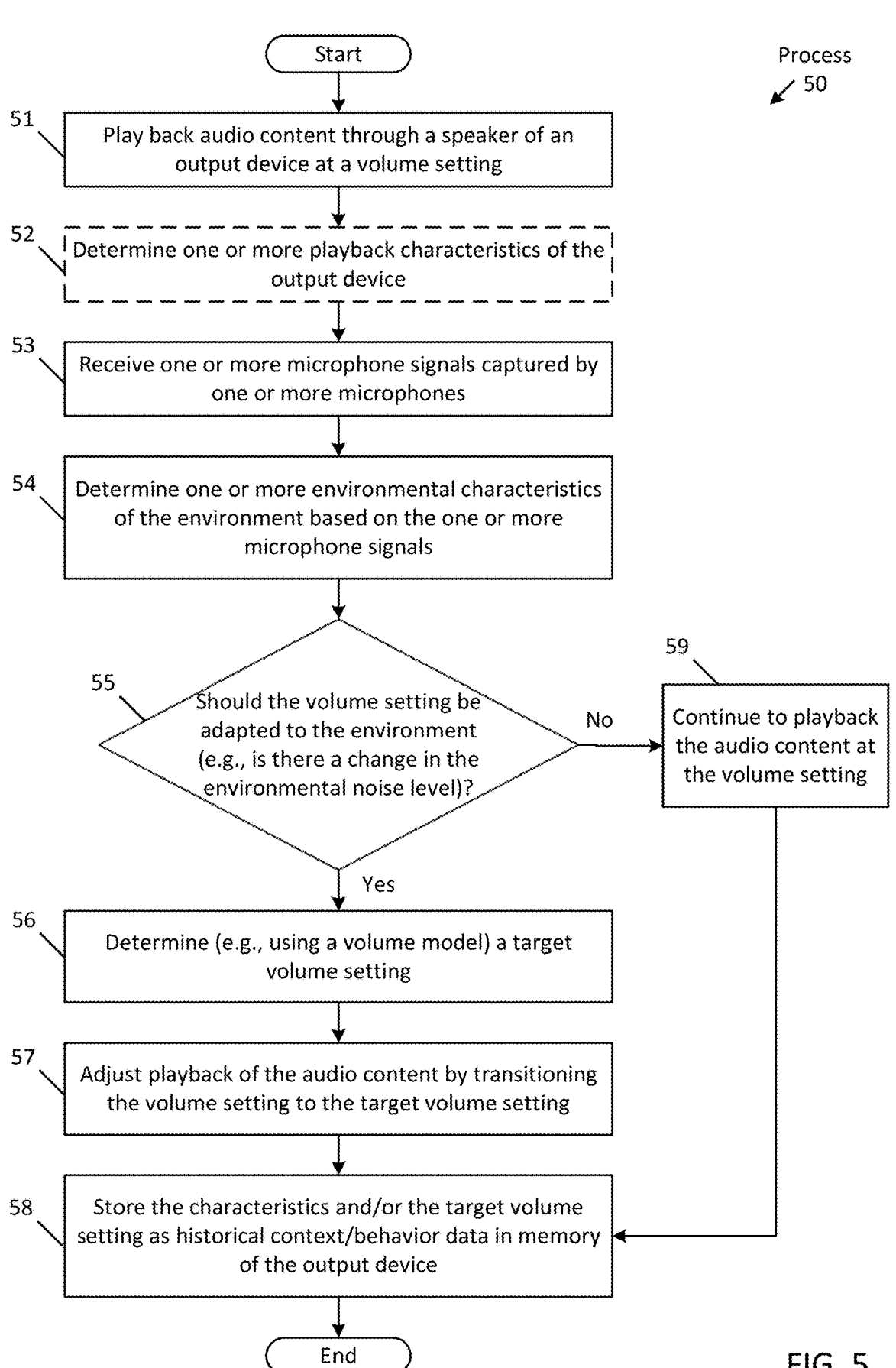

Process
50

Start

51 — Play back audio content through a speaker of an output device at a volume setting 52 — Determine one or more playback characteristics of the output device 53 — Receive one or more microphone signals captured by one or more microphones 54 — Determine one or more environmental characteristics of the environment based on the one or more microphone signals 55 — Should the volume setting be adapted to the environment (e.g., is there a change in the environmental noise level)?

No → 59 — Continue to playback the audio content at the volume setting

Yes

56 — Determine (e.g., using a volume model) a target volume setting

57 — Adjust playback of the audio content by transitioning the volume setting to the target volume setting 58 — Store the characteristics and/or the target volume setting as historical context/behavior data in memory of the output device End

FIG. 5

Process
80

1st Stage
110
(Threshold is below input Level, e.g., due to audio content being louder than environmental noise)
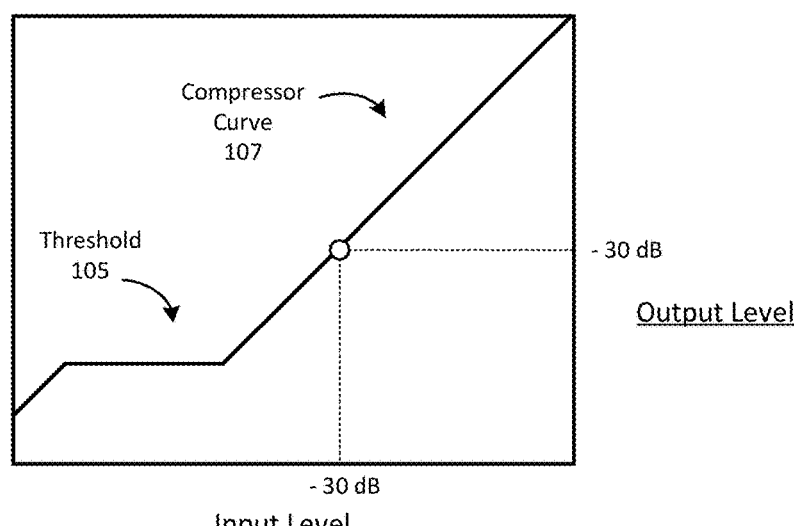
2nd Stage
111
(Output level increased due to threshold increasing, e.g., due to environmental noise becoming louder)
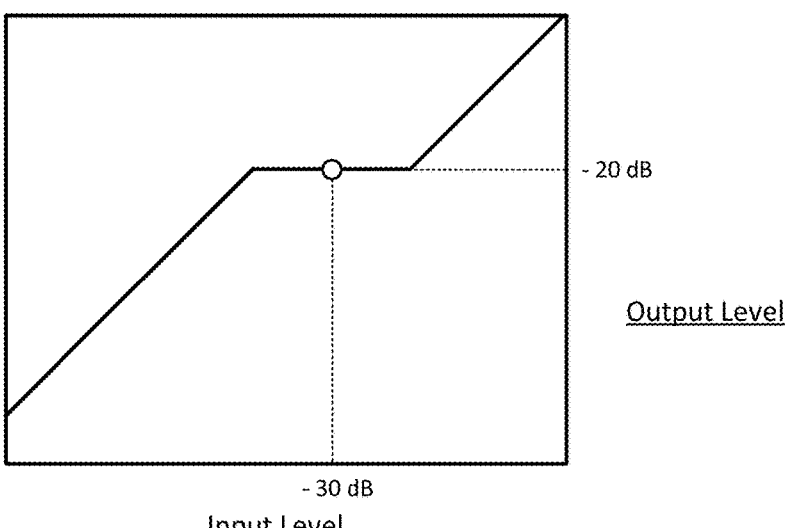
3rd Stage
112
(Output level remains the same as input level decreases, e.g., due to content getting quieter)
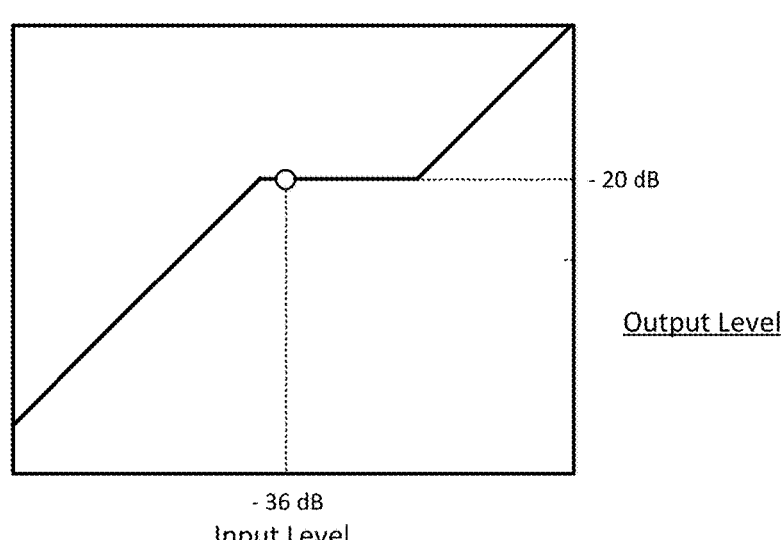
Fig. 12

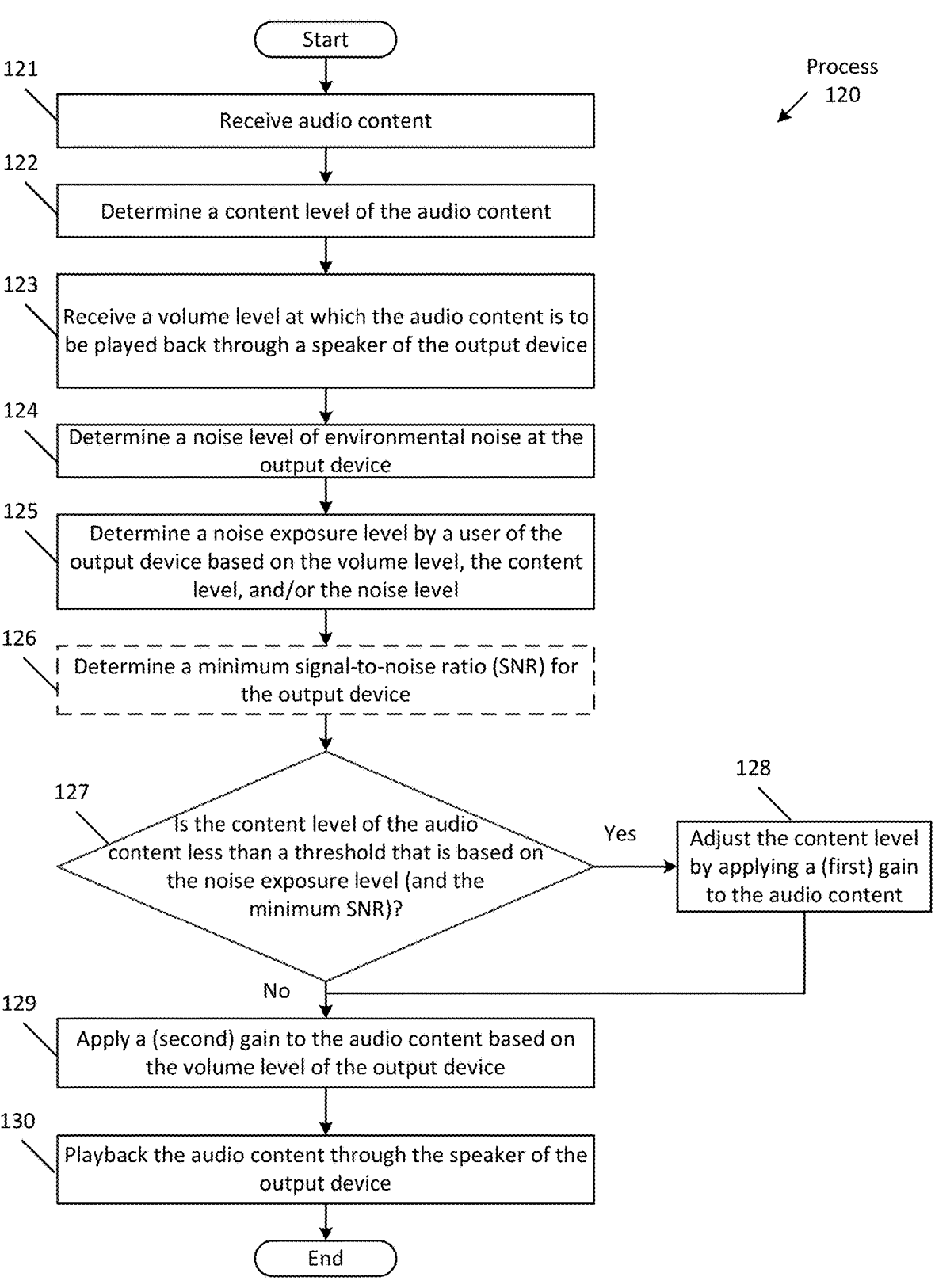

Process 120

Start

121 Receive audio content

122 Determine a content level of the audio content

123 Receive a volume level at which the audio content is to be played back through a speaker of the output device 124 Determine a noise level of environmental noise at the output device 125 Determine a noise exposure level by a user of the output device based on the volume level, the content level, and/or the noise level 126 Determine a minimum signal-to-noise ratio (SNR) for the output device 127 Is the content level of the audio content less than a threshold that is based on the noise exposure level (and the minimum SNR)?

Yes → 128 Adjust the content level by applying a (first) gain to the audio content No 129 Apply a (second) gain to the audio content based on the volume level of the output device 130 Playback the audio content through the speaker of the output device

End

FIG. 13

METHOD AND SYSTEM FOR AUDIO COMPRESSION FOR CONTEXTUAL VOLUME CONTROL

RELATED APPLICATIONS

This application claims the benefit of priority of U.S. Provisional Application No. 63/499,194, filed Apr. 28, 2023, which is herein incorporated by reference.

FIELD

An aspect of the disclosure relates to a system that adapts volume to changes in the environment based on historical user context and user behavior. Other aspects are also described.

BACKGROUND

Headphones are an audio device that includes a pair of speakers, each of which is placed on top of a user's ear when the headphones are worn on or around the user's head. Similar to headphones, earphones (or in-ear headphones) are two separate audio devices, each having a speaker that is inserted into the user's ear. Both headphones and earphones are normally wired to a separate playback device, such as an MP3 player, that drives each of the speakers of the devices with an audio signal in order to produce sound (e.g., music). Headphones and earphones provide a convenient method by which the user can individually listen to audio content without having to broadcast the audio content to others who are nearby.

SUMMARY

According to an aspect of the disclosure, a method includes: receiving audio content; receiving a volume level at which the audio content is to be played back through a speaker of the headset that is worn by a user; determining a noise level of environmental noise at the headset; determining a noise exposure level by the user based on the volume level, a content level of the audio content, and the noise level; determining whether a content level of the audio content is less than a threshold dependent on the noise exposure level; and responsive to determining that the content level is less than the threshold, adjusting the content level by applying a gain to the audio content such that the gain-adjusted content level of the audio content is at least equal to the noise exposure level.

In one aspect, the method further includes: determining a sensitivity of the headset; determining a sound output level of the headset based on the sensitivity of the headset and the content level of the audio content; and producing an adjusted noise level by subtracting the sound output level from the noise level, wherein the noise exposure level is based on the adjusted noise level. In another aspect, determining the noise exposure level further comprises subtracting the volume level from the adjusted noise level. In one aspect, the noise level is a loudness, k-weighted, full-scale (LKFS) value. In another aspect, the noise exposure level is a LKFS value.

In one aspect, the gain is a first gain, wherein the method further comprises: producing a volume-adjusted piece of audio content by applying a second gain according to the volume level subsequent to the application of the first gain; and playing back the volume-adjusted piece of audio content through the speaker of the headset. In another aspect, the content level is a first content level of a first portion of the piece of audio content, wherein the method further comprises: receiving a second portion, subsequent to the first portion, of the piece of audio content; determining that a second content level of the second portion is greater than the environmental noise exposure level; and ceasing to apply the gain. In some aspects, adjusting the content level comprises applying upwards compression to the audio content.

In one aspect, the method further comprising determining the threshold as a compression threshold of the upwards compression based on the noise exposure level, wherein the upwards compression is applied responsive to the content level being less than the compression threshold. In another aspect, the method further comprising determining a minimum signal-to-noise ratio (SNR) of the content level with respect to the noise exposure level, wherein the compression threshold is a combination of the noise exposure level and the minimum SNR. In another aspect, when the minimum SNR is greater than zero, the content level of the piece of audio content is adjusted to be greater than the noise exposure level.

In one aspect, the method further comprising determining a minimum SNR of the content level, wherein determining whether the content level of the piece of audio content is less than the threshold comprises determining whether the content level is less than a combination of the noise exposure level and the minimum SNR. In another aspect, determining the minimum SNR includes retrieving the minimum SNR from memory.

In one aspect, receiving the noise level comprises receiving a plurality of noise levels, each a loudness, LKFS value, wherein the method further comprises applying a smoothing filter to filter out one or more outlier LKFS values. In another aspect, the smoothing filter is a median filter. In one aspect, receiving the volume level comprises determining the volume level as output of a machine learning (ML) model based on at least the noise level as input. In one aspect, receiving the volume level comprises receiving a user adjustment of a volume control.

According to another aspect of the disclosure, a method includes: determining a volume level at which audio content is to be played back through a speaker of a headset that is to be worn by a user; determining a noise level of environmental noise at the headset; determining a noise exposure level by the user while wearing the headset based on the volume level and the noise level; determining whether a content level of the audio content is less than a threshold that is based on the noise exposure level; and responsive to the content level being less than the noise exposure level, applying audio compression upon the audio content such that the content level is at least equal to the noise exposure level.

In one aspect, determining the noise level comprises receiving, over a wireless connection, the noise level from the headset. In another aspect, the method further comprising receiving, over a wireless connection, a volume setting of the headset, wherein the volume level is determined according to the volume setting, wherein the volume setting is produced by the headset based on a user-adjustment of a volume control of the headset or a volume ML model that outputs the volume setting responsive to the noise level as input. In another aspect, applying audio compression comprises applying producing a gain-adjusted audio signal by applying a scalar gain to an audio signal of the audio content, wherein the method further comprises transmitting, over a wireless connection, the gain-adjusted audio signal to the headset to drive a speaker of the headset.

In one aspect, the method further comprising: determining a sound output level of the headset based on a sensitivity of the headset and the content level of the audio content; and producing an adjusted noise level by subtracting the sound output level from the noise level. In another aspect, determining the noise exposure level comprises subtracting the volume level from the adjusted noise level.

In one aspect, the method further includes: determining a minimum SNR of the content level with respect to the noise exposure level; and determining the threshold as a combination of the minimum SNR and the noise exposure level. In one aspect, the electronic device is a portable electronic device that is in wireless communication with the headset. In another aspect, the portable electronic device comprises a smartphone, a laptop computer, or a smartwatch. According to another aspect of the disclosure includes a system or an electronic device as shown and as described herein. According to another aspect of the disclosure is a method substantially as herein described.

According to another aspect of the disclosure, an electronic device includes at least one processor; and memory having instructions stored therein which when executed by the at least one processor causes the electronic device to: determine a volume level at which audio content is to be played back through a speaker of a headset that is to be worn by a user; determine a noise level of environmental noise at the headset; determine a noise exposure level by the user while wearing the headset based on the volume level and the noise level; determine whether a content level of the audio content is less than a threshold that is based on the noise exposure level; and responsive to the content level being less than the noise exposure level, apply audio compression upon the audio content such that the content level is at least equal to the noise exposure level.

In one aspect, the instructions to apply audio compression includes instructions to produce a gain-adjusted audio signal by applying one or more gains to an audio signal of the audio content, wherein the memory has further instructions to transmit, over a wireless connection, the gain-adjusted audio signal to the headset to drive a speaker of the headset.

According to another aspect of the disclosure, a non-transitory machine-readable medium having instructions which when executed by at least one processor of an output device, causes the output device to: receive audio content; receive a volume level at which the audio content is to be played back through a speaker of the output device; determine a noise level of environmental noise; determine a noise exposure level by a user of the output device based on at least one of the volume level, a content level of the audio content, and the noise level; determine whether a content level of the audio content is less than a threshold based on the noise exposure level; and responsive to determining that the content level is less than the threshold, apply audio compression upon the audio content such that the content level of the audio content is at least equal to the noise exposure level.

In one aspect, the instructions to receive the noise level includes instructions to: receive a plurality of noise levels, each LKFS value, wherein the non-transitory machine-readable medium; and apply a smoothing filter to the plurality of noise levels to filter out one or more outlier LKFS values.

The above summary does not include an exhaustive list of all aspects of the disclosure. It is contemplated that the disclosure includes all systems and methods that can be practiced from all suitable combinations of the various aspects summarized above, as well as those disclosed in the Detailed Description below and particularly pointed out in the claims. Such combinations may have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIG. 5 is a flowchart of one aspect of a process for adapting volume control using a machine learning (ML) model and storing data in memory of output device.

FIG. 12 shows several stages of applying DRC upon audio content based on changes to the content level according to one aspect.

FIG. 13 is a flowchart of one aspect of a process for performing DRC operations.

DETAILED DESCRIPTION

Figure 1:
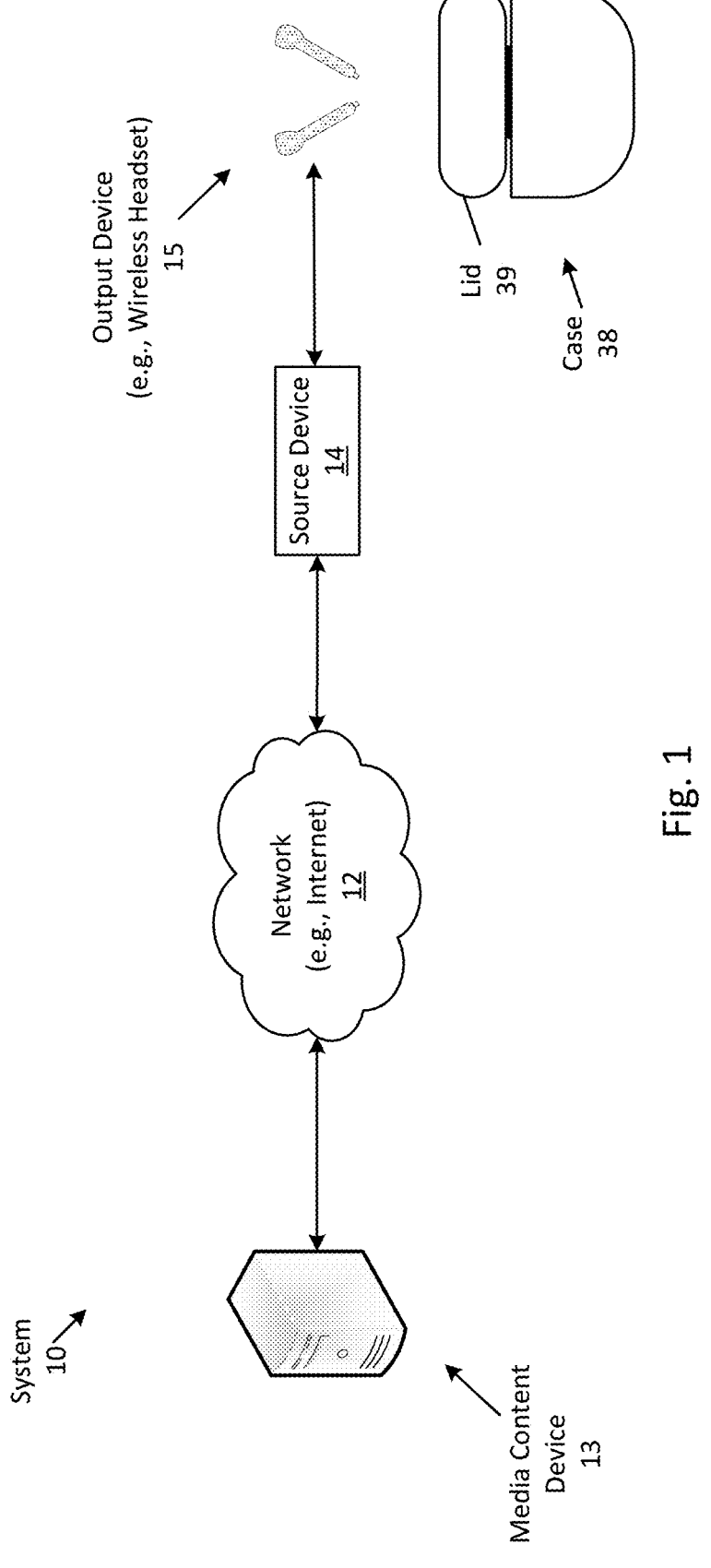
FIG. 1 shows a system that performs contextual adaptive volume control according to one aspect.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Electronic headsets have become increasingly popular with users because they are capable of reproducing media content such as music, podcasts, and movie soundtracks with high fidelity while at the same time not disturbing others who are nearby. Such headsets may also allow users the ability to move about an environment or between different environments while continuing to hear audio that is reproduced through speakers of the headset. For example, a runner may listen to a podcast while navigating through a running trail. As another example, a commuter who rides a train to work may wear a wireless headset while riding the train to and from work.

As a wearer of a headset that is reproducing audio content moves throughout an environment, noise levels within the environment may change. Returning to the previous examples, as the runner navigates the running trail there may be times at which there is little noise, such as portions of the trail that pass through a forested area, whereas there may be other portions of the trail that are close to a highway that have a considerable amount of highway noise. With the commuter example, a noise level of the train may be high, due to the movement of the train, which may contrast with less noise around the train station platform where the user boarded the train. In either case, the fluctuations in noise level may cause the user to periodically change the volume level of the sound output. For example, the runner may wish to change the volume between different environments in order to maintain user awareness within the environments, such as turning down the volume in quiet areas. The commuter, on the other hand, may want a higher volume level while on the train in order to prevent the background noise from interfering with or masking the reproduced audio content that is perceived by the user.

Between these scenarios, both users are required to manually change the volume to their desired levels. This has many disadvantages that may reduce the overall user experience. First, most wireless headsets stream audio from a user companion device, such as a smart phone or a desktop computer. In the case of a smartphone, each time the user wishes to change the volume, the user must acquire the smartphone (e.g., pulling the smart phone from a pocket), and adjust a volume control of the smartphone. Having to interact with the smartphone to manually change the volume each time the noise level increases or decreases may be cumbersome and time consuming. In addition, although the user may change the volume, the user may not adjust the volume setting to a user-preferred setting. For example, when there is a lot of noise, the user may turn up the volume, which may result in the volume setting being too loud. As a result, the user may then again have to adjust the volume downward in order to fine-tune the output. Again, such actions may be cumbersome and may retract from the overall user experience. Therefore, there is a need for a system that performs adaptive volume control based on the environment and based on historical user context and/or user behavior.

To overcome these deficiencies, the present disclosure describes a contextual adaptive volume (or auto-volume) system that is capable of automatically (e.g., without user intervention) adapting volume control based on environmental conditions (or characteristics), such as noise level, and based on learned user preferences. Returning to the commuter example, the system may be configured to automatically adapt volume control while the user is on the train based on historical data that indicates that the user tends to have the volume louder while on the train as opposed to while at the train station. In particular, the system performs at least some operations automatically by not requiring user intervention, such as requiring that the user adjust a volume control on a companion device or on the headset itself. As a result, the system is capable of providing the user with an enjoyable user experience between different environments with minimal to no user interaction with the system, by taking into account the context in which the user is using the headsets and past user behavior.

The system may be an auto-volume system that provides an adaptive volume control based on learned user preferences. For example, the system may keep track of historical data that indicates a behavior of a listener, such as whether the listener prefers louder content than quieter content, and context, such as whether the listener prefers to listen to louder content in louder environments or in quieter environments. As a result, the system is capable of compensating for environmental changes. Such compensation, however, may not take into account the content level of the audio content that is being played back. For example, an auto-volume system may be capable of adapting volume to a noisy environment, but if the audio content level changes during playback, such as getting quieter due to quieter dialog for example, the loud environmental noise may still adversely affect the sound output by masking the quieter portions of the content. Therefore, there is a need for a contextual auto-volume system that compensates for changes in content level.

To overcome these deficiencies, the present disclose describes a system that performs dynamic range compression (DRC) upon audio content to which volume control is being adapted to environmental noise. Specifically, the present disclosure provides a system that assesses audio content that is being played back through an output device in relation to the environment of the output device. In particular, the system determines the environmental noise level that represents the noise exposure of the user while using the output device and determines the relationship between the content level and the environmental noise level. If the environmental noise level is louder than the content level, which may be the case when the content level is quieter dialog or a quiet portion of a musical composition, the environmental noise level may mask the content level. As a result, the system may use DRC to increase the content (or volume) level in order to be at least equivalent to the environmental noise level, such as having a signal-to-noise ratio (SNR) of zero (or more). As a result, the system may continuously monitor the changing content level in relation to the environmental level, and adjust the DRC accordingly. This may have the benefit of ensuring that quiet portions of the content remain intelligible, thereby keeping the original audible intent of the audio content and therefore improving the user experience.

As referenced herein, "audio content" may be (and include) any type of audio, such as a musical composition, a podcast, audio of a virtual reality (VR) environment, a soundtrack of a motion picture, etc. In one aspect, the audio content may be a part of a piece of audio content, which may be an audio program or audio file that includes one or more audio signals that includes at least a portion of the audio content. In some aspects, the audio program may be any type of audio content format. In one aspect, an audio program may include audio content for spatial rendering as one or more data files in one or various three-dimensional (3D) audio formats, such as having one or more audio channels. For instance, an audio program may include a mono audio channel or may be a multi-audio channel format (e.g., two stereo channels, six surround source channels (in 5.1 surround format), etc.). In another aspect, the audio program may include one or more audio objects, each having at least one audio signal, and positional data (for spatially rendering the object's audio signals) in 3D sound. In another aspect, the audio program may be represented in a spherical audio format, such as higher order ambisonics (HOA) audio format.

FIG. 1 shows a block diagram of a contextual adaptive volume (or auto-volume) control system (which may be referred to herein as "system") 10 that may be configured to perform contextual adaptive volume control operations, as described herein. In particular, the system may adapt the volume of audio content to a target volume level that is being played back based on environmental characteristics (or conditions) and/or based on historical user context and/or user behavior. For example, the system 10 may adapt the volume of the output device 15 based on changes to noise levels within the environment, such as a noise level that increases as a user moves from a quiet environment to a noisy environment. Specifically, the system may adapt the volume control to increase the volume based on the noisy environment and based on user preferences, such as historical data that indicates that the user listens to audio content at higher volume levels while in noisy environments, which may be similar to or the same as the environment in which the user is currently located.

In one aspect, the system 10 may adapt volume in "real-time" such that the volume may be changed as environmental conditions, user context, and/or user behavior change. In some aspects, the system may perform adaptive volume operations in real-time such that the volume may be changed with a minimum amount of time (e.g., accounting for processing time of one or more electronic components of the system, such as one or more processors) from when changes to the environment and/or user context are detected by the system.

As shown, the system 10 includes a source (or audio source) device 14, an output (or audio output) device 15, a (e.g., computer) network (e.g., the Internet) 12, and a media content server 13. In one aspect, the system may include more or fewer elements, such as having additional content servers, or not including content servers and/or a source device. In which case, the output device may perform all (or most) operations, such as the adaptive volume control operations, as described herein.

In one aspect, the media content server 13 may be a stand-alone electronics server, a computer (e.g., desktop computer), or a cluster of server computers that are configured to store, stream, and/or receive digital content, such as audio content (e.g., as one or more audio signals in any audio format). In another aspect, the content server may store video and/or audio content, such as movies, for streaming (transmitting) to one or more electronic devices. As shown, the server is communicatively coupled (e.g., via the network 12) to the source device 14 in order to stream (e.g., audio) content for playback (e.g., via the output device). In another aspect, the content server may be communicatively coupled (e.g., directly) to the output device.

In one aspect, the source device 14 may be any electronic device (e.g., with electronic components, such as one or more processors, memory, etc.) that is capable of streaming audio content, in any format, such as stereo audio signals, for playback (e.g., via one or more speakers integrated within the source device and/or via one or more output devices, as described herein). For example, the source device may be a desktop computer, a laptop computer, a digital media player, etc. In one aspect, the device may be a portable electronic device (e.g., being handheld operable), such as a tablet computer, a smart phone, etc. In another aspect, the source device may be a wearable device (e.g., a device that is designed to be worn on (e.g., attached to clothing and/or a body of) a user, such as a smartwatch.

In one aspect, the output device 15 may be any (e.g., portable) electronic device that includes at least one speaker and is configured to output (or playback) sound by driving the speaker(s) with audio signal(s). For instance, as illustrated the device is a wireless headset (e.g., in-ear headphones or earphones) that are designed to be positioned on (or in) a user's ears and are designed to output sound into the user's ear canal. In some aspects, the earphone may be a sealing type that has a flexible ear tip that serves to acoustically seal off the entrance of the user's ear canal from an ambient environment by blocking or occluding in the ear canal. As shown, the output device includes a left earphone for the user's left ear and a right earphone for the user's right ear. In this case, each earphone may be configured to output at least one audio channel of audio content (e.g., the right earphone outputting a right audio channel and the left earphone outputting a left audio channel of a two-channel input of a stereophonic recording, such as a musical work). In another aspect, the output device may be any electronic device that includes at least one speaker and is arranged to be worn by the user and arranged to output sound by driving the speaker with an audio signal. As another example, the output device may be any type of headset, such as an over-the-ear (or on-the-ear) headset that at least partially covers the user's ears and is arranged to direct sound into the ears of the user. In another aspect, the output device may be a wearable electronic device, such as smart glasses or a smart watch.

In some aspects, the output device may be a head-worn device, as illustrated herein. In another aspect, the output device may be any electronic device that is arranged to output sound into an ambient environment. Examples may include a stand-alone speaker, a smart speaker, a home theater system, or an infotainment system that is integrated within a vehicle. In another aspect, the output device as a head-worn device may be arranged to output sound into the ambient environment. For instance, when the output device is a pair of smart glasses, the output device may include "extra-aural" speakers that are arranged to project sound into the ambient environment (e.g., in a direction that is away from at least a portion, such as ears or ear canals, of a wearer), which are in contrast to "internal" speakers of a pair of headphones that are arranged to project sound into (or towards) a user's ear canal when worn.

As described herein, the output device may be a wireless device that may be communicatively coupled to the source device in order to exchange (e.g., audio) data. For instance, the source device may be configured to establish the wireless connection with the output device via a wireless communication protocol (e.g., BLUETOOTH protocol or any other wireless communication protocol). During the established wireless connection, the source device may exchange (e.g., transmit and receive) data packets (e.g., Internet Protocol (IP) packets) with the output device, which may include audio digital data in any audio format.

In another aspect, the source device 14 may communicatively couple with the output device 15 via other methods. For example, both devices may couple via a wired connection. In this case, one end of the wired connection may be (e.g., fixedly) connected to the output device, while another end may have a connector, such as a media jack or a universal serial bus (USB) connector, which plugs into a socket of the source device. Once connected, the source device may be configured to drive one or more speakers of the output device with one or more audio signals, via the wired connection. For instance, the playback device may transmit the audio signals as digital audio (e.g., PCM digital audio). In another aspect, the audio may be transmitted in analog format.

The system 10 also includes a case 38 that is designed to hold the output device 15 while it is not in use by the user. The case includes a lid 39 that may be closed in order to at least partially seal the output device within an interior space of the case. As described herein, the output device 15 may be configured to perform one or more contextual adaptive volume control operations (which may be referred to as "adaptive volume control operations" as described herein) based on the state of the lid and/or of the output device. In particular, once the lid is opened, by a user of the output device for example, the output device may be configured to perform at least some adaptive volume control operations. More about the output device performing adaptive volume control operations based on the state of the lid is described herein.

In one aspect, the output device 15 may detect the state of the lid. For example, the output device may (periodically) monitor sensor data from one or more sensors, such as a proximity sensor (not shown). In another aspect, the case 38 may include circuitry, such as one or more processors, memory, and a network interface, which allows it to (wirelessly) communicate with the output device. As a result, the case may detect (e.g., based on sensor data captured by one or more sensors of the case) that the state of the lid 39 has moved from a closed state to an open state, and in response may transmit a message to the output device, indicating that the lid's state has changed. In another aspect, the output device may be configured to determine the state of the lid through any known method.

In some aspects, the source device 14 and the output device 15 may be distinct (separate) electronic devices, as shown herein. In another aspect, the source device may be a part of (or integrated with) the output device. For example, at least some of the components of the source device (such as one or more processors, memory, etc.) may be part of the output device, and/or at least some of the components of the output device may be part of the source device. In which case, at least some of the operations performed by the source device (e.g., streaming audio content from the media content server 13) may be performed by the output device.

Figure 2:
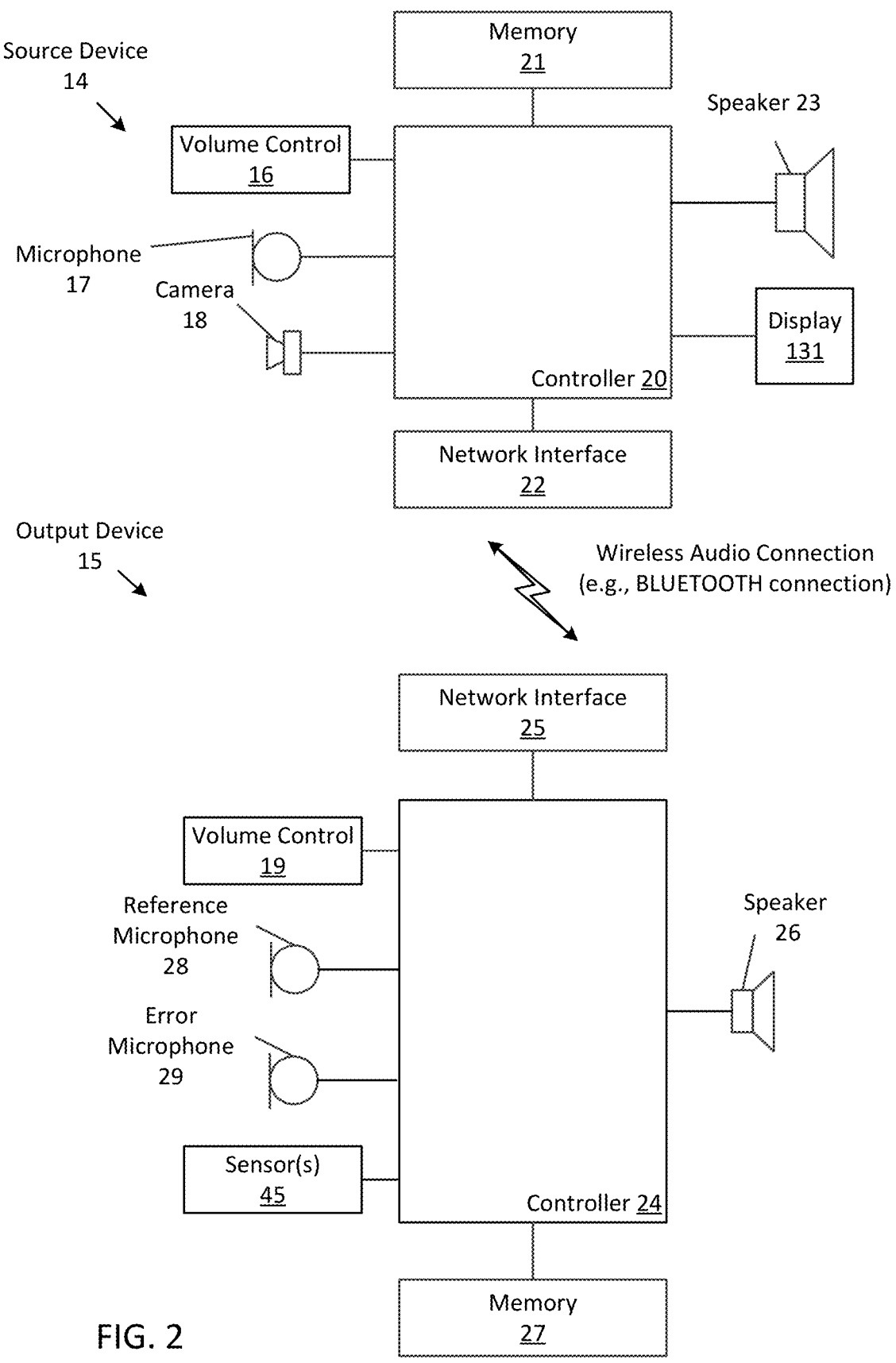
FIG. 2 shows a block diagram of the source device and the output device of the system according to one aspect.

FIG. 2 shows a block diagram of the source device 14 and of the output device 15 that are both wirelessly coupled together according to one aspect. The source device 14 includes a controller 20, memory 21, a network interface 22, a speaker 23, a display 131, a microphone 17, a camera 18, and a volume control 16. In one aspect, the source device may include more or less elements as described herein. For instance, the device may include several speakers and/or microphones, or may not include the camera or the display.

The controller 20 may be a special-purpose processor such as an application-specific integrated circuit (ASIC), a general-purpose microprocessor, a field-programmable gate array (FPGA), a digital signal controller, or a set of hardware logic structures (e.g., filters, arithmetic logic units, and dedicated state machines). The controller is configured to perform adaptive volume control operations, audio signal processing operations and/or networking operations. More about the operations that may be performed by the controller 20 are described herein.

In one aspect, the memory 21 may be any type of non-transitory machine-readable storage medium. Examples may include read-only memory, random-access memory, CD-ROMs, DVDs, magnetic tape, optical data storage devices, flash memory devices, and phase change memory.

The camera 18 may be a complementary metal-oxide-semiconductor (CMOS) image sensor that is capable of capturing digital images including image data that represent a field of view of the camera, where the field of view includes a scene of an environment in which the source device 14 is located. In some aspects, the camera may be a charged-coupled device (CCD) camera type. The camera is configured to capture still digital images and/or video that is represented by a series of digital images. In one aspect, the camera may be positioned anywhere about/on the source device. In some aspects, the source device may include multiple cameras (e.g., where each camera may have a different field of view).

The microphone 17 may be any type of microphone (e.g., a differential pressure gradient micro-electro-mechanical system (MEMS) microphone) that is configured to convert acoustical energy caused by sound wave propagating in an acoustic environment into a microphone signal. In some aspects, the microphone may be an "external" (or reference) microphone that is arranged to capture sound from the acoustic environment. In another aspect, the microphone may be an "internal" (or error) microphone that is arranged to capture sound (and/or sense pressure changes) inside a user's ear (or ear canal).

The speaker 23 may be an electrodynamic driver that may be specifically designed for sound output at certain frequency bands, such as a woofer, tweeter, or midrange driver, for example. In one aspect, the speaker 23 may be a "full-range" (or "full-band") electrodynamic driver that reproduces as much of an audible frequency range as possible.

The display 131 is designed to present (or display) digital images or videos of video (or image) data. In one aspect, the display may use liquid crystal display (LCD) technology, light emitting polymer display (LPD) technology, or light emitting diode (LED) technology, although other display technologies may be used in other aspects. In some aspects, the display may be a touch-sensitive display screen that is configured to sense user input as touches or taps on the screen, and in response produce one or more control signals. In some aspects, the display may use any touch sensing technologies, including but not limited to capacitive, resistive, infrared, and surface acoustic wave technologies.

The volume control 16 is configured to adjust a volume level of sound output of the source device (and/or the output device 15) in response to receiving a user-adjustment (e.g., user input) at the control. In one aspect, the volume control may be a "master" volume control that is configured to control the overall volume level (e.g., sound output level of the speaker 23) of the source device. In another aspect, when the output device is communicatively coupled with the source device in order to stream audio content to the output device, for playback, the volume control may control the overall volume level of the output device (as well). In one aspect, the volume control may be a "physical" volume control that may be a dedicated volume input control, such as one or more buttons, a rotatable knob, or a physical slider. For instance, the volume control 16 may include at least two buttons, a "volume up" button, which may be configured to perform a stepwise increase to the volume each time it is pressed by the user, and a "volume down" button that may be configured to perform a stepwise decrease to the volume each time it is pressed by the user. In some aspects, the volume control may be any type of physical input device that can adjust the volume level.

In one aspect, the system 10 may include one or more volume settings, each setting defining a different volume level (e.g., dB). In particular, either volume control 16 and/or 19 of the output device may include a series of one or more volume settings (or positions), where each setting defines a different volume level (e.g., a different sound output level (e.g., dB SPL)) of the system 10. In particular, the volume control may (e.g., in response to a user-adjustment) incrementally increase or decrease the volume level based on a user adjusting the control's volume setting or position. For example, when the volume control is a rotatable volume knob, the control may have several (e.g., 18) volume settings, where each successive volume setting may correspond to a degree of rotation and may increase the overall volume by a particular gain value. Specifically, each volume setting may result in a stepwise increase (or decrease) of the system volume. In this case, each volume setting may correspond to a 20° rotation about a center axis of the volume control. For instance, a first volume setting may be 0°, where the overall volume is muted (e.g., having a sound output level of 0 dB), a second volume setting may be 20° that may increase the output level by a particular value, such as 20 dB. Thus, the knob produces a control signal that either incrementally increases or decreases the volume based on how much the knob is twisted and in what direction (e.g., turning clockwise increases the volume, whereas turning counterclockwise decreases the volume). In one aspect, the volume control may be a master volume control that is configured to provide bi-directional control for either incrementally increasing or decreasing an overall volume level of (e.g., sound output of) the device. In one aspect, the control may be a part of the source device (e.g., integrated on the device). In another aspect, the volume control may be a part of an electronic device that is communicatively coupled with the source device.

In one aspect, each volume setting may be associated with a volume (or a particular gain value) that may be applied to one or more audio signals. In particular, in the case in which the volume control is a button, each volume setting of the button may correspond to a particular gain value that may be applied to audio content (that is being played back by the system 10). For example, when a volume control has a volume setting range from 0-10, the highest volume setting, 10, may have a volume level of 0 decibels full scale (dBFS), while the next volume setting down, 9, may have a volume level of −10 dBFS. In which case, when the volume setting is reduced from 10 to 9, the system may be configured to apply attenuation (or gain) of −10 dB to an output audio signal. If pressed by the user again, the volume setting would be reduced to 8, causing the total amount of attenuation to be applied to −20 dB.

In one aspect, the volume control may be a "software" volume control as. In one aspect, the volume control may be a software volume control such that a software application (e.g., a media player application) that may be executing on the source device performs one or more digital signal processing operations to modify one or more digital audio signals associated with audio content. In some aspects, adjustments to the control may result in one or more gains being applied to the digital audio signal.

In one aspect, the volume control 16 may be a user interface (UI) item that is displayed on (e.g., a graphical user interface (GUI) within) the display 131 of the source device. For example, the volume control may be a slider that may be translated along a predefined slidable range. When user input is received to adjust (or translate) the position of the slider (e.g., by the user touching the slider on the display screen and dragging it in one or more directions), the volume control adjusts the overall volume level based on the position of the slider. In one aspect, similar to the example of the physical control, the UI item may include several volume settings, where each position of the slider may correspond to a different volume level for the device. In one aspect, the software volume control may adjust the volume by applying one or more scalar gain values upon one or more digital audio signals in order to scale the levels of the signals.

In some aspects, the volume control may be any input by a user of the device. For example, the input may include a gesture (e.g., a hand gesture, a finger gesture, a head gesture, etc.) made by the user and detected by the device (e.g., based on movement detected by a motion sensor, such as an inertial measurement unit (IMU), of the source device that is caused by the hand gesture). In another aspect, the volume control may be a voice command that is received via the microphone 17. In which case, the voice command may include a request to turn up or down the volume.

The output device 15 includes a controller 24, a network interface 25, a speaker 26, two microphones 28 and 29, one or more (other) sensors 45, a volume control 19, and memory 27. In one aspect, the device may include more or less elements. For example, the output device may include one or more speakers, and/or may include one or more microphones. In one aspect, microphone 28 may be a reference microphone and microphone 29 may be an error microphone, as described herein. In another aspect, the output device may not include an error microphone, or may include at least one reference microphone and at least one error microphone. For example, in the case of a headset, an error microphone may sense sound inside the user's ear when the headset is positioned on (or in) the user's ear.

The sensor(s) 45 may include one or more other sensors that are designed to produce sensor data. For instance, the sensors may include an IMU or a proximity sensor. In which case, the IMU may be designed to produce motion data that indicates (changes in) the position and/or orientation of the output device. In another example, the sensors may include an accelerometer that may be arranged and configured to receive (detect or sense) speech vibrations that are produced while a user (e.g., who may be wearing the output device) is speaking, and produce an accelerometer signal that represents (or contains) the speech vibrations. Specifically, the accelerometer is configured to sense bone conduction vibrations that are transmitted from the vocal cords of the user to the user's ear (ear canal), while speaking and/or humming. For example, when the audio output device is a wireless headset, the accelerometer may be positioned anywhere on or within the headphone, which may touch a portion of the user's body in order to sense vibrations.

In one aspect, controller 24 may be configured to perform contextual adaptive volume control operations, (other) audio signal processing operations and/or networking operations, as described herein. For instance, the controller may be configured to obtain (or receive) audio data (as an analog or digital audio signal) that includes audio content, such as music for playback through the speaker 26. In some aspects, the controller may obtain audio data from memory 27, or the controller may obtain audio data from another device, such as the source device via the network interface 25. For instance, the output device may stream an audio signal from the source device (e.g., via the BLUETOOTH connection) for playback through the speaker 26. The audio signal may be a signal input audio channel (e.g., mono). In another aspect, the controller may obtain two or more input audio channels (e.g., stereo) for output through two or more speakers. In one aspect, in the case in which the output device includes two or more speakers, the controller may perform additional audio signal processing operations.

In one aspect, the volume control 19 may perform similar operations as the volume control 16 of the source device. For instance, upon receiving user input, the control 19 may adjust the (e.g., overall) volume of sound output by the (e.g., speaker 26 of the) output device 15. In some aspects, the volume control 19 may be used to adjust the volume at the source device, and as a result, upon receiving user input, the output device 15 may transmit a message (control) signal to the source device 14 indicating a user-adjustment of the volume control 19. In particular, the message may include the resulting volume setting at which the user adjusted the volume control. In one aspect, the source device, may use the signal to adjust the volume of one or more audio signals at the source device. More about adjusting the volume is described herein.

Figure 3:
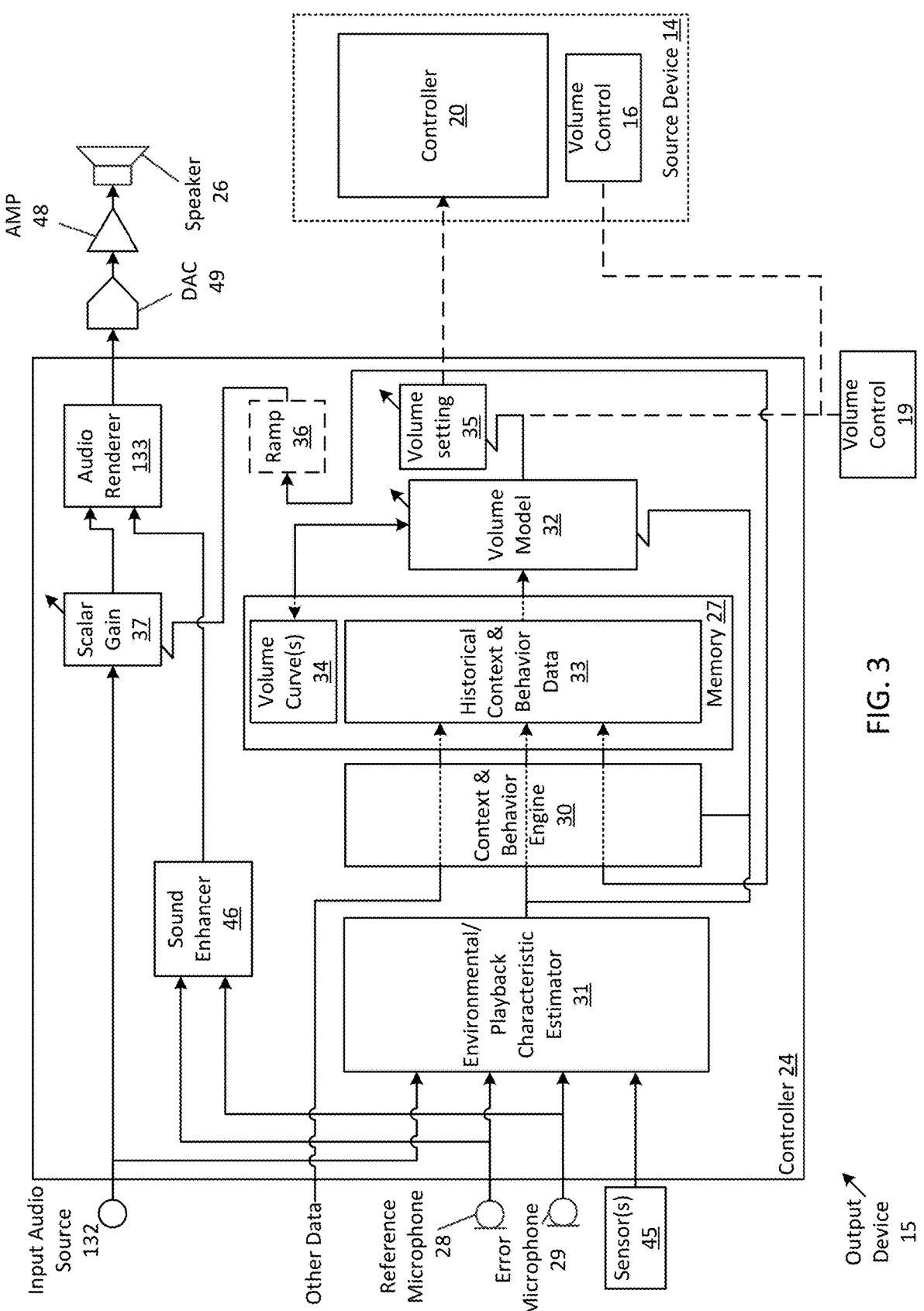
FIG. 3 illustrates a block diagram of the output device that performs contextual adaptive volume control operations according to one aspect.

In one aspect, the volume control 19 may be a software volume control. In another aspect, the control 19 may be a "hardware" volume control, which may set (or adjust) volume settings for one or more hardware components (e.g., the digital-to-analog converter (DAC) 49 or the amplifier (AMP) 48, as shown in FIG. 3) of the output device 15. For example, adjustments to the volume control 19 may increase or decrease the gain applied by the AMP 48 to one or more audio signals. In one aspect, the hardware volume control 19 may adjust volume digitally, by applying one or more gains to one or more audio signals of audio content that is being played back by the output device. In another aspect, the hardware volume control may adjust the volume as described with respect to a software volume control.

In one aspect, the output device 15 may be an "active" or "powered" device, which draws power from an (external and/or internal) power source to power at least some of its components. For instance, the output device may be a wired or wireless headset, which when paired with (e.g., communicatively coupled via a wire and/or wireless connection) to the source device, draws power an internal source (e.g., a battery storage) to power (at least) the AMP 48 for driving the speaker 26. An example of such an output device may be a pair of wireless earphones that may pair with the audio source device via any wireless protocol, such as BLUETOOTH protocol, as illustrated in FIG. 1.

In another aspect, the output device 15 may be a "passive" or "non-powered" device, which is designed to draw power from an external power source, such as a companion device to which it is coupled. For example, the output device 15 may be wired in-ear headphones that may be coupled to a companion (or source) device (e.g., a multi-media device), which may drive one or more speakers of the output device. In which case, the source device to which the output device is coupled may perform the contextual adaptive volume control operations described herein.

In one aspect, one or more of the devices of the system 10 may be configured to perform (e.g., additional) audio signal processing operations based on one or more elements, such as one or more microphones and/or speakers, that are coupled to a device's respective controller. For instance, when the output device includes two or more "extra-aural"

speakers, which are arranged to output sound into the acoustic environment rather than speakers that are arranged to output sound into a user's ear (e.g., as speakers of an in-ear headphone), the controller may include a sound-output beamformer that is configured to produce speaker driver signals which when driving the two or more speakers produce spatially selective sound output. Thus, when used to drive the speakers, the output device may produce directional beam patterns that may be directed to locations within the environment.

In some aspects, the controller 24 may include a sound-pickup beamformer that can be configured to process the audio (or microphone) signals produced two or more microphones of the output device to form directional beam patterns (as one or more audio signals) for spatially selective sound pickup in certain directions, so as to be more sensitive to one or more sound source locations. In some aspects, the controller may perform audio processing operations upon the audio signals that contain the directional beam patterns (e.g., perform spectrally shaping).

In one aspect, operations performed by the controllers may be implemented in software (e.g., as instructions stored in memory and executed by either controller) and/or may be implemented by hardware logic structures as described herein.

In another aspect, at least some of the operations performed by the system 10 as described herein may be performed by the source device 14 and/or by the output device 15. For instance, the source device may include two or more speakers and may be configured to perform sound-output beamformer operations (e.g., when the source device includes two or more speakers). In another aspect, at least some of the operations may be performed by a remote server that is communicatively coupled with either device, for example over the network (e.g., Internet).

In one aspect, at least some elements of the source device 14 and/or the output device 15 may be integrated (or a part of) each the respective device. For example, when the output device is on-ear headphones, the microphone and the speaker may be a part of at least one earcup of the headphones that is placed on a user's ear. In another aspect, at least some of the elements may be separate electronic devices that are communicatively coupled to the device. For instance, the display 131 may be a separate device (e.g., being a display monitor or television) that is communicatively coupled (e.g., wired or wirelessly connected) with the source device to receive image data for display. As another example, the camera 18 may be a part of a separate electronic device (e.g., a webcam) that is coupled to the local device to provide captured image data.

FIG. 3 illustrates a block diagram of the output device 15 that performs contextual adaptive volume control operations according to one aspect. Specifically, the output device includes an input audio source 132, the microphones 28 and 29, the controller 24, the DAC 49, the AMP 48, and the speaker 26. The DAC 49 may be arranged to receive an (e.g., output) audio signal as an output digital audio signal that may be produced by the controller 24 or from the input audio source 132 (and/or obtained from the source device as a digital audio signal), and is to convert it into an analog signal. The AMP 48 may be arranged to obtain the analog signal from the DAC, and may provide a driver signal to the speaker 26. In one aspect, the AMP is to amplify the analog signal (e.g., to a level that is high enough to drive the speaker 26). In one aspect, the controller 24 may be configured to adjust the amplification of the AMP based on the (e.g., volume setting of the) volume control 19 and/or the volume control 16 of the source device. In one aspect, the scalar gain block 37 may be a part of the DAC and/or AMP. Although the DAC and AMP are shown as separate blocks, in one aspect the electrical circuit components for these may be combined in order to provide for a more efficient digital-to-analog conversion and amplification operation of the driving signal, e.g., using class D amplifier technology.

The input audio source 132 may include a programmed processor that is running a media player software application and may include a decoder that is producing an input audio signal as digital audio input to the (e.g., controller 24 of the) output device. In one aspect, the programmed processor may be a part of the output device, such that the media player is executed within the device. In another aspect, the media player may be executed by (e.g., one or more programmed processors of) another electronic device, such as the source device 14 or the media content server 13. For instance, the source device may execute the media player and may (e.g., wirelessly) transmit audio content (as one or more audio signals) to the output device. In some aspects, the decoder may be capable of decoding an encoded audio signal, which has been encoded using any suitable audio codec, such as, e.g., Advanced Audio Coding (AAC), MPEG Audio Layer II, MPEG Audio Layer III, or Free Lossless Audio Codec (FLAC). Alternatively, the input audio source 132 may include a codec that is converting an analog or optical audio signal, from a line input, for example, into digital form for the controller. Alternatively, there may be more than one input audio channel, such as a two-channel input, namely left and right channels of a stereophonic recording of a musical work, or there may be more than two input audio channels, such as for example the entire audio soundtrack in 5.1-surround format of a motion picture film or movie. In one aspect, the input source 132 may provide a digital input or an analog input.

In one aspect, the audio content received from the input audio source 132 may be any type of audio content. As described herein, the source may be a media player software application that may provide media audio content associated with the (executing) application. For example, the audio content may be a musical composition, a movie soundtrack, a podcast, etc. In another aspect, the input audio source may be any type of software application that may be configured to provide audio content to the output device. As an example, the source 132 may include a telephony software application that may be configured to provide telephony audio content as a downlink audio signal of a call that may be established between the output device 15 and another (e.g., remote) electronic device. As another example, the source may include a virtual personal assistant (VPA) software application that may be configured to provide VPA audio content that may include audible notifications of the VPA, which may be provided responsive to commands or requests of a user of the output device, for playback through the speaker 26 of the by the output device 15.

As shown, the controller 24 of the output device has several operational blocks for performing one or more digital signal processing operations, such as contextual adaptive volume control operations, as described herein. In particular, the controller 24 includes an environmental/playback characteristics estimator 31, a context & behavior engine 30, a volume model 32, a sound enhancer 46, a volume setting 35, a ramp 36, a scalar gain 37, and an audio renderer 133. In one aspect, at least some of these operational blocks may perform one or more operations while the output device 15 is in an "on-state" or in use by a user. For instance, in the case in which the output device is an in-ear headset, the operations described herein may be performed while the in-ear headset is worn by and is at least partially inserted into the ear of the user. In another aspect, the operations may be performed while audio content is streamed by the output device 15 (e.g., and is being played back through the speaker 26).

During playback of audio content, the scalar gain 37 may be configured to receive an input audio signal (or one or more signals) of the audio content from the input audio source 132, and apply a gain based on the volume setting 35, such that the audio content is played back at a desired volume level (associated with the volume setting). The controller 24 may be configured to playback the gain-adjusted audio signal by using the signal to drive the speaker 26. Thus, the output device may be configured to playback the audio content at a given (or target) volume setting. As described herein, the contextual adaptive volume control operations performed by the controller may adjust playback of the audio content by applying a gain to the audio signal based on a target volume setting.

In one aspect, the output device may be configured to operate in one of several audio processing modes. For instance, the output device may be user-configured (e.g., through an input device) to operate in a mode, or may be automatically configured by the output device based on one or more criteria. The audio processing modes include an active noise cancelation (ANC) mode, an ambient sound enhancement (ASE) mode, a combination of both modes, and/or a passive mode. More about these modes are described herein.

In one aspect, the sound enhancer 46 may be configured to cause the output device to operate in one of the audio processing modes. In particular, the enhancer may be configured to receive a (reference) microphone signal that includes sounds of the environment captured by the reference microphone 28 and/or receive a (error) microphone signal that includes sounds captured inside or next to a user's ear, while the output device is worn by a user, captured by the error microphone 29. The enhancer may be configured to perform an ANC function, while the output device is in an audio processing mode that operates in the ANC mode, to cause the speaker 26 to produce anti-noise in order to reduce ambient noise from the environment that is leaking into the user's ears. In particular, the enhancer may use one or more of the microphone signals to implement a feedforward ANC, a feedback ANC, or a combination thereof. In one aspect, the ANC function may be a feedforward ANC that is configured to generate an anti-noise signal based on sound captured (e.g., by one or more reference microphones) in the acoustic environment. In another aspect, the ANC function may be a feedback ANC that is configured to generate an anti-noise signal based on sound captured by one or more error microphone signals.

In some aspects, the ANC function may implement a combination of the feedforward and feedback ANC to produce the anti-noise. In one aspect, the ANC function performed by the sound enhancer 46 may be adaptive to changing sounds. In particular, the sound enhancer 46 may adjust one or more ANC gains, which may be scalar (wide-band) gain blocks configured to raise (or lower) a level of produced anti-noise (signal) and/or may adjust one or more ANC filters based on changes to the environment (e.g., based on changes to the environmental noise level).

In another aspect, the sound enhancer 46 may be configured to perform an ASE function, while the output device is in an audio processing mode that operates in the ASE mode, in which sound played back by the output device may be a reproduction of ambient sound that is captured by one or more reference microphones. Such a function may be referred to as a "pass through" or "transparency" mode in which sounds of the environment are reproduced by the speaker 26 (as one or more ASE signals) in a "transparent" manner, e.g., as if the output device were not being worn by the user (when the output device is a headset). The sound enhancer processes at least one microphone signal captured by at least one reference microphone 28 and filters the signal through a transparency filter and/or transparency gain to produce one or more ASE signals, which may reduce acoustic occlusion due the audio output device being on, in, or over the user's ear, while also preserving the spatial filtering effect of the wear's anatomical features (e.g., head, pinna, shoulder, etc.). The filter also helps preserve the timbre and spatial cues associated with the actual ambient sound. In one aspect, the filter of the transparency function may be user specific according to specific measurements of the user's head. For instance, the sound enhancer may determine the transparency filter according to a head-related transfer function (HRTF) or, equivalently, head-related impulse response (HRIR) that is based on the user's anthropometrics.

Another example of the sound enhancer 46 may perform a combination of both ANC and ASE functions. Specifically, the enhancer may be configured to produce one or more anti-noise signals and/or one or more ASE filtered signals, which when used to drive the speaker 26 may attenuate at least some ambient noise and/or pass through one or more ambient noises. While operating in the passive mode, the enhancer may be configured to not perform an ANC function or the ASE function. In which case, the output device may provide only passive attenuation from the ambient environmental noise, while neither the ANC nor the ASE mode are active.

The audio renderer 133 may be configured to receive one or more audio signals from the input audio source 132 (or from the scalar gain 37), and render the signals into one or more driver signals for driving the speaker 26. In particular, the renderer may receive a gain-adjusted audio signal from the scalar gain 37 that may adjust the signal according to the volume setting (e.g., adapted volume setting) of the output device. In one aspect, the renderer may receive one or more anti-noise signals and/or one or more ASE signals from the enhancer 46, and may render the signals for playback through the speaker 26. In another aspect, the renderer may combine the signals from the enhancer 46 and from the scalar gain 37 (e.g., via matrix multiplication), and may render the combined signals.

In some aspects, the audio renderer 133 may perform spatial audio rendering operations in order to spatially render one or more audio signals. For example, the renderer may apply spatial filters (e.g., HRTFs) that are personalized for the user of the audio system in order to account for the user's anthropometrics. In another aspect, the spatial filters may be default filters. As a result, the renderer is configured to produce spatial audio signals (e.g., binaural audio signals), which when outputted through speaker 26 produces a 3D sound (e.g., giving the user the perception that sounds are being emitted from a particular location within an acoustic space). The environmental/playback characteristic estimator 31 may be configured to determine (or estimate) characteristics of the environment of the output device and/or configured to determine playback characteristics that may be associated with features or conditions during which audio playback is occurring through the output device 15. In one aspect, environmental characteristics may be measured (or estimated) features or conditions within the environment of the output device 15. In one aspect, the characteristics may be determined while the output device is in an "on-state" in which the output device is being used by a user of the system 10. For instance, when the output device is a headset, it may be in an on-state when worn on the user's head, and performing one or more operations, such as an ANC function and/or playing back audio content. In another aspect, the device may be in an on-state when the device is active (powered) or performing one or more operations, such as playing back audio content. In another aspect, the estimator may determine at least some characteristics while the output device is in an "off-state," such as while the device is off the user's head, but may remain powered.

In one aspect, one or more environmental characteristics may be determined based on an acoustic analysis of one or more microphone signals captured by one or more reference microphones and/or one or more error microphones. For instance, the estimator may be configured to determine the environmental noise level of ambient noise from within an acoustic environment in which the output device and/or source device are located. For instance, the estimator may be configured to receive a microphone signal captured by microphone 28, where the microphone signal may include one or more ambient noises within the acoustic environment. The estimator may use the microphone signal to measure (or estimate) an environmental noise level of the acoustic environment (e.g., as a dB sound pressure level (SPL) value). In one aspect, the environmental noise level may be an A-weighting sound pressure level value (e.g., as a dBA value).

In another aspect, the environmental noise level may include (or be) an "in-ear" or "headset" noise level estimate that may refer to the amount of noise exposure perceived by the user, while wearing the output device. In particular, when the output device 15 is an in-ear headset, the in-ear noise level may be the amount of noise that leaks from the environment into the user's ear. In one aspect, this environmental noise level may be captured by the error microphone. The estimator 31 may receive a microphone signal captured by the error microphone 29, and may use the microphone signal to estimate the in-ear noise level (e.g., as a dBA value).

In another aspect, the estimator 31 may estimate the in-ear noise level based on the reference microphone signal captured by the reference microphone 28 and based on the audio processing mode in which the output device 15 may be operating. In particular, the estimator may use an estimated amount of attenuation due to active and/or passive attenuation by the output device due to the mode in which the output device is operating and use the reference microphone to determine the in-ear noise level. In particular, the estimator determines the audio processing mode in which the output device may be operating, and determines the environmental noise level as the in-ear noise level based on the microphone signal and the audio processing mode.

In one aspect, the estimator 31 estimates the in-ear noise level by determining an amount of attenuation due to the audio processing mode that the sound enhancer 46 is operating. For example, the estimator may determine an amount of attenuation based on ANC and/or ASE characteristics and/or based on the passive attenuation due to the output device. For instance, when ANC is active, the estimator may determine the attenuation level based on the ANC filter and/or ANC gain that is being applied by the sound enhancer while the ANC function is active. Similarly, when the ASE function is active, the estimator may determine an amount of attenuation due to the ASE function based on the ASE filters or ASE gains. In one aspect, the estimator may perform a table lookup into a data structure that associates attenuation levels with ANC and/or ASE characteristics, described herein.

As described herein, the estimator 31 may determine a passive attenuation level based on the coupling of the output device 15. In which case, the estimator may perform a fit estimation process to determine the quality of the coupling of the output device to the user. In particular, when the output device is a headset, the estimator performs the fitting process to determine how leaky the output device is (e.g., due to openings between the headset and a portion of the user's ear or head, due to the headset not providing an optimal fit). For instance, the estimator may receive the error microphone signal of the error microphone 29, and estimate (measure or determine) a transfer function (or frequency response) that represents a travel path between the speaker 26 and the error microphone 29 (e.g., as the output device plays back audio content or a test signal). In another aspect, the transfer function may be determined as part of an active ANC function. For instance, the controller may be configured to perform adaptive feedback ANC to adapt an ANC filter according to an estimate of a secondary path (or S-path) transfer function that represents the travel path between the speaker and the microphone, which the ANC function may use to adjust an adaptive digital filter used to produce the anti-noise signal. In one aspect, the S-path transfer function may be estimated, while the ANC function is activated (e.g., based on user input received by the output device), or may be estimated as part of the ANC function, but while the ANC function is not generated anti-noise. In another aspect, the estimator may determine a transfer function between the reference microphone and the error microphone, and may use this transfer function to determine the fit of the output device.

With the attenuation levels associated with the ANC/ASE functions and/or the passive attenuation determined, the estimator may be configured to determine the in-ear noise level based on the sum of the attenuation level(s) and the measured sound level of the reference microphone signal(s), and by producing the in-ear noise level.

In one aspect, the estimator 31 may determine the in-ear noise level after the sound enhancer 46 performs the dynamic adaptive ANC or ASE functions to produce anti-noise through the speaker 26. For example, as described herein, the output device may be an in-ear headset, where sound at the user's ear may include noise that leaks into (through the coupling of the in-ear headset and the user's ear) the user's ear canal and sound produced by the speaker 26. In which case, when the ANC function is performed, the perceived noise by the user may be reduced. As a result, in order to determine a more accurate in-ear noise level measurement, the estimator 31 may receive a microphone signal from the reference microphone after the speaker produces (or plays back) the anti-noise. As a result, the anti-noise cancels out at least some of the environmental noise, thereby resulting in less perceived noise by the user. In which case, the estimator may determine the in-ear noise level from the reference microphone to account for canceled noise at the user's ear based on the produced anti-noise, as described herein (e.g., based on the ANC filter(s) and/or ANC gain(s) used to cancel out the noise that leaked into the user's ear).

As described thus far, the estimator 31 may determine the in-ear noise level based on the reference microphone signal and an attenuation level due to active ANC/ASE functions and/or the coupling of the output device to the user. In which case, the attenuation may be frequency dependent, such that it accounts for different attenuation effects across one or more frequency bands. In particular, the estimator may determine, for each frequency band of several bands across a frequency range, one or more attenuation levels based on the audio processing mode, such as based on the characteristics described herein. In particular, the attenuation level may include several attenuation levels (e.g., in dB), each level associated with a different frequency band within a range of frequency bands). In one aspect, the in-ear noise level may be produced (e.g., as a A-weighted value) based on the reference microphone signal, such as one or more noise levels across one or more frequency bands and the determined attenuation level for that those respective frequency bands.

In one aspect, the estimator 31 may take into account audio playback by the output device when determining the in-ear noise level. In particular, during audio playback, the in-ear noise level may result in an output sound level of the audio playback in combination with a noise level of noise that leaks into the user's ears. In which case, the estimator may account for the audio playback and determine the noise level as representing only (or the majority of) the noise from the environmental, which may not have been canceled by the anti-noise produced by the controller 24, as described herein, that leaks into the user's ears. In some aspects, to account for the audio content the estimator may subtract the content level of the audio content from the in-ear noise level. In another aspect, the controller may account for the audio playback by combining the sound level of the playback with the estimated noise level. As a result, the in-ear noise level may be a combination of the audio playback and the environmental noise that leaks into the user's ears, thus being an aggregate noise exposure level value perceived by the user. In which case, the in-ear noise level may be a sound output level (dBA) at the user's ear.

In one aspect, the estimator 31 may determine the environmental noise level based on one or more audio samples of the microphone signals captured by the reference microphone 28 and/or the error microphone 29. For instance, each audio sample may represent a portion of a microphone signal over a period of time. The estimator may be configured to remove outlier samples from the captured samples. For example, the estimator may determine whether spectral content (energy level) of a sample exceeds a standard deviation of a median (or average) spectral content. If so, the sample may be used to determine at least one of the noise levels. In one aspect, the estimator may determine the noise levels upon determining that a group of one or more samples exceed the standard deviation. In particular, upon determining that the group of samples exceeds a threshold of samples, one or more noise levels may be determined based on the group of samples. If so, the estimator may process the samples to determine the noise levels, such as applying one or more filters, such as a median filter, to the group of samples.

In one aspect, the estimator 31 may perform smoothing operations in order to filter out transient or unwanted sounds (e.g., sounds that may cause an inaccurate estimation of the environmental noise level). For instance, the estimator 31 may be configured to analyze one or more microphone signals of one or more of the microphones to identify sounds of the environment that may be captured by the microphones. For instance, the estimator may be configured to perform a spectral analysis upon the reference microphone signal captured by the reference microphone to detect a presence of sounds, such as wind noise or speech. For instance, the estimator may estimate a wind noise level (e.g., based on spectral content across one or more frequency bands) within the environment. In another aspect, the estimator may be configured to perform a speech recognition algorithm upon the microphone signals to detect speech captured from within the environment. In one aspect, the estimator may be configured to distinguish between the speech of the user of the output device (own voice) and speech of someone else. For example, the estimator may receive an accelerometer signal from an accelerometer of the output device, and may be configured to determine whether the user is speaking based on the accelerometer signal. In another aspect, the estimator may determine whether the user is speaker based on a comparison between the microphone signals and the accelerometer signal (e.g., by comparing one or more frequency bands). In which case, the estimator may remove or filter out audio samples that may be associated with the transient sounds.

In another aspect, the estimator may perform a crosstalk analysis to determine whether the reference microphone signal is capturing audio content that is being played back through the speaker of the output device. For instance, the estimator may analyze the reference microphone signal with respect to an audio signal used to drive the speaker (e.g., to determine whether there is a threshold of correlation). If so, the estimator may filter out audio samples that may include crosstalk.

The estimator 31 may be configured to estimate the content level (or signal level) of the audio content. For instance, the estimator may measure the (e.g., instantaneous) signal level of one or more audio signals of the audio content, in dBFS, for example. In another aspect, the estimator may determine the content level as a loudness of the audio content. For example, the estimator may determine the loudness, A-weighted measurement of the audio content or K-weighted, relative to full-scale (LKFS) measurement of the audio content. In one aspect, the measurement may be an average loudness over a duration of the audio content. In another aspect, the estimator may estimate a momentary (or instantaneous) loudness measurement. In which case, the estimator may determine the loudness of the audio signal over a period of time, such as one second, two seconds, three seconds, etc.

In one aspect, the estimator 31 may be configured to determine a signal-to-noise ratio (SNR) of the output device. In particular, the estimator may estimate the SNR of one or more audio signals of the audio content. In particular, the estimator may monitor spectral content of an audio signal that is being played back by the speaker 26 within certain time intervals, such as 10 milliseconds, and may monitor the in-ear noise level during the same period of time. The estimator may subtract the (e.g., spectral content) of the audio signal from the in-ear noise level to determine the ratio of audio content with respect to noise that is being heard by the user. In another aspect, the estimator may determine the SNR by subtracting the audio signal from a microphone signal of the error microphone 29.

In one aspect, the estimator 31 may be configured to detect changes of one or more characteristics. For instance, the estimator may periodically estimate characteristics, such as the environmental noise level and the in-ear noise level for any changes, whether either increases or decreases (e.g., above a threshold) from a previously estimated level. As described herein, the controller 24 may adapt the volume setting of the output device based on detected changes by the estimator.

The context and behavior engine 30 may be configured to receive data, such as the characteristics generated by the estimator 31, changes to the volume setting 35 based on user-adjustments to the volume control 19, and/or the other data received by the output device, and may be configured to store the received data as historical context/behavior data 33 in the memory 27. The engine 30 may store at least some of the received data, which indicates the context in which the output device has been used by the user. For instance, the data may indicate environmental data and playback data that may be gathered (e.g., periodically), as the user uses the output device (e.g., while the device is in an on-state). User behavior may indicate actions or inactions performed by the user, with respect to the context in which the device was used. As describe herein, the user behavior may be based on whether the user increased or decreased the volume level based on the context of the device, such as whether the device was in a noisy environment or a quiet environment, based on environmental noise estimation.

In one aspect, the engine 30 may store data according to a determined user context of the system 10 and/or according to user behavior. For example, the engine may store volume settings which may be user-defined (and/or model-defined, as described herein) with respect to one or more characteristics, such as environmental noise levels and in-ear noise levels that may be measured with respect to the volume settings. In which case, the engine may store volume settings at which the user listens to audio content with respect to the noise levels of the environment in which the user is located while listening to the audio content and in-ear noise levels. In particular, the engine is storing volume settings as the user's behavior with respect to various noise levels in which the user is listening to audio content through the output device. The engine 30 may also store the content level of the audio content that may be played back by the output device. In another aspect, the engine may store other information, such as whether the ANC function (and/or which ANC function, such as feedback ANC) is active, whether the ASE function is active, and whether environmental sounds, such as wind noise (and/or the wind noise level) or speech is present within the environment.

For example, the data 33 may include a table with one or more rows, each row associating a current (or changed) volume setting with at least some of the received data, such as the environmental noise level, the in-ear noise level, etc. In another aspect, the data 33 may store volume settings of the output device associated with one or more characteristics. As an example, for each environmental noise level, of several noise levels ranging from a low noise level (e.g., 20 dB) to a high noise level (e.g., 100 dB), the data 33 may include a rolling list of one or more volume settings that have been set by the user and/or by the system or model (as described herein) over a period of time when the output device is exposed to that specific environmental noise level. In another aspect, each row of the table may be associated with a (different) ranges of one or more environmental noise levels, where each range may be associated with one or more volume settings that have been set within that range. For instance, a range may include from 45 dB to 55 dB, where the range may include several volume settings of the output device within that 10 dB range. In another aspect, the engine may store other characteristics within the data 33.

The data 33 may be "historical" in that the engine 30 may be configured to store at least some of the received data, while the output device is in use, for a period of time, such as a day, a week, a month, etc. In which case, the historical data 33 may be personalized for a user of the output device

15. In particular, the historical data may indicate the context and the behavior of a user (or owner) of the output device, as the user uses the device. As described herein, the culmination of this data may indicate user preferences in various contexts. For example, the output device may collect data for a period of time, where the data may indicate the user's behavior in various contexts, such as how loud (e.g., on average) the user listens to audio content in a quiet environment (e.g., associated with a particular environmental noise level). Once a sufficient amount of data is collected, the controller 24 may use the data to train the volume model 32 to perform adaptive volume control operations that may be personalized for the user. As described herein, the model may use the historical data to determine the volume level, while the user listens to audio content in another quiet environment. More about the volume model is described herein.

In one aspect, the engine may store the historical data 33 periodically. For example, the engine may store data, e.g., in the data 33, every second, minute, hour, etc. In which case, the engine may store data that is received at that time. In which case, each time the engine stores data, it may associate the data together, such as storing the data in a common table (data structure) and/or by associating the data with a timestamp. As a result, the historical data may keep track of the context of the output device and the user's behavior at any given time.

In another aspect, the engine 30 may store data based on user behavior. In particular, data may be stored based on a user action (or input), such as when a user changes the volume setting 35 (e.g., in response to receiving a user-adjustment to the volume control 19). In which case, at each volume change, the engine may receive at least some data, and store it together in the data 33. As a result, the historical data may indicate the context (e.g., characteristics) associated with a user changing the volume. This may provide the system insight into how the user prefers the volume level when certain characteristics are present, such as the in-ear noise level. In another aspect, once a determination is made to store data, the engine 30 may gather data for a period of time, and store a median or average value based on the gathered data. For example, once a volume setting change occurs, the engine may receive a plurality of environmental noise level estimates within a time window, such as the next five seconds. The engine may calculate a median noise level, and store that median level. In one aspect, when there are multiple consecutive user changes to the volume control, the engine may store data associated or received at the last volume change.

As described thus far, the engine 30 may store data based on a user action, such as the user adjusting the volume control. In particular, a user action may include the system 10 receiving user input via one or more input devices, such as the volume control 19 receiving user input (e.g., by pressing down a button of the volume control 19) to change the volume setting 35 to either increase or decrease the volume level of the system. In another aspect, the engine may store data based on other actions. For example, the user action may be a user-adjustment via other methods, such as via a voice command that may be received by the controller 24 through one or more microphones.

In another aspect, user behavior may be an action performed by the user that is not explicitly received to change the volume setting of the output device. For instance, an action may be user movement within the environment of the output device, such as moving from one location in a room, which may be loud, to another location in the same room, being a quiet corner. As another example, the user movement may be between two different environments, such as moving from a quiet restaurant into a noisy sidewalk adjacent to a busy intersection. Although the movement may not change the volume, the resulting reduction in noise may increase the perceptibility of the audio content. Movement may be determined based on IMU data or GPS data (as the other data) that is received from an IMU or a GPS sensor, respectively, of the system 10. User inaction, on the other hand, may relate the system 10 not receiving user input and/or detecting a non-explicit action. More about user inaction is described herein.

In one aspect, the engine 30 may store data based on user inaction. For example, the engine 30 may store data based on whether one or more characteristics change, while the user does not change the volume setting. For example, if the environmental noise level increases above a threshold, the engine 30 may store data associated with that change, even though the user may have not changed the volume setting. This may indicate that the user is satisfied listening to the audio content with a lower SNR. In another aspect, the engine may store data based on user action that is not explicitly received to change the volume setting, such as moving between environments, as described herein.

Returning to the estimator 31, other characteristics, such as playback characteristics of the output device may be determined to indicate the context in which the user is using the output device. For example, the estimator 31 may be configured to receive audio content from the input audio source 132, as one or more input audio signals, and may be configured to perform an audio content analysis of the audio content to determine playback characteristics, such as a content level, metadata related to the audio content, and/or other audio characteristics. As an example, the estimator may perform a spectral analysis upon the audio content to determine at least some characteristics. For instance, the spectral analysis may identify descriptive information of audio content, such as a type of the audio content, a title of the audio content, a genre of the audio content (e.g., when the audio content is a musical composition), a duration of the audio content, a performer/writer of the audio content, etc. In particular, the estimator may use the spectral content to perform a table lookup into a data structure (stored within memory 27) that associates spectral content with descriptive information (metadata) associated with the audio content. The estimator may also determine one or more software applications to which the audio content belongs. For instance, the estimator may determine (e.g., based on metadata contained with the audio data), whether the audio content is media content, telephony content, or VPA content. As another example, the estimator may determine time of day as a playback characteristic, since the user of the output device may have varying user preferences based on the time of day (e.g., listening to quieter audio content at nighttime as opposed to louder audio content during the daytime).

In another aspect, the estimator may determine other characteristics of the audio content. For example, the estimator may be configured to identify one or more sound sources within the audio content. The estimator may perform a spectral analysis, such as blind source separation, to identify one or more sound sources (locations and/or identification of the sound source, such as the type of sound associated with the sound source) within the audio content. In another aspect, the estimator 31 may determine characteristics based on metadata that may be received with the audio content. For instance, when the audio content is a song, audio data of the song may include metadata that indicates a title of the song and a duration of the song. In which case, the estimator may analyze the metadata to determine at least some of the characteristics of the content.

The controller 24 may receive other data. In one aspect, the other data may be from one or more sensors of the output device and/or of the source device. For instance, the data may include location data (e.g., position and/or orientation within the environment) of the output device, which may be received from a location sensor, such as a Global Positioning System (GPS) sensor of the output device. In another aspect, the other data may image data captured by one or more cameras, such as camera 18 of the source device 14. In one aspect, the controller 24 may be configured to perform an image recognition algorithm upon the image data to detect objects within the environment. For instance, the controller 24 may be configured to identify objects and/or people within the environment using the image data. In another aspect, the controller may use the image data to determine the position and/or orientation of the output device. In another aspect, the other data may include metadata regarding the audio content and/or the environment in which the output device is located. For instance, the source device may be configured to perform one or more of the operations of the estimator 31 and may be configured to transmit that information to the output device 15. As described herein, this other data may be stored in the historical data 33 to further indicate user context, while the user uses the output device, such as indicating the location of the user while listening to a particular piece of audio content.

As described thus far, the engine 30 may store the historical context/behavior data 33 that includes various characteristics, such as environmental noise levels (e.g., in-ear noise levels) with respect to volume settings that have been user-defined. In another aspect, the engine 30 may store other data described herein that indicate different contexts in which the user is using the output device as historical data. As one example, the engine may store (e.g., in one or more associated tables) a volume setting of the output device with respect to the type of audio content that is being played back, the location at which the user is playing back the audio content, and/or other estimated characteristics. Returning to the commuter example, the historical data may include volume settings of the output device for different types of audio content, such as audio content played back by a media player, audio content of a VPA application, etc., that are being played back while the user is riding the train. In another aspect, the engine may store volume settings according to any variation of characteristics as user context. As another example, the engine 30 may store volume settings within a particular environment when particular sounds are captured from within the environment, such as speech. In which case, the engine may store historical data 33 that indicates the volume setting of the output device while the user engages in a conversation with another person. As described herein, this historical data may be used to train the volume model 32 in order to adapt the volume setting of the output device when future contexts (similar or the same to those stored in the historical data) occur.

As described thus far, the historical data stored by the engine provides user context and the user behavior while the user uses the output device. In one aspect, the engine may store, or group data together based on a determined user context and/or user behavior. Specifically, the engine 30 may be configured to store at least some received data in memory 27, according to user context and/or user behavior. For instance, the engine 30 may be configured to determine the context (or conditions) in which the user is wearing or holding the output device (e.g., on the user's head) and/or may indicate the context in which the user is using the output device, such as conditions during which the user is using the output device to playback audio content.

User context may be determined based on one or more characteristics received from the environmental/playback characteristic estimator 31 and/or the other data that may be received by the output device. For example, metadata of audio content may include descriptive information regarding audio content that is (currently) being played back, such as the type of audio content (e.g., whether a VPA notification, whether media player audio content, etc.), the title of the audio content, the genre of audio content, etc. In another aspect, the other data received by the controller may include the location (e.g., based on location data received by the controller 24) at which the user is listening to the audio content. For example, the location may be an environment, such as a train station or a gymnasium. The received characteristics may indicate the context in which the output device is being used. For instance, the characteristics of the environment may indicate that the output device is being used in a quiet environment based on the environmental noise level and/or the in-ear noise level. As another example, the characteristics may indicate whether there are ambient noises or sounds within the environment, such as speech of the user of the output device or speech of another person within the environment and/or other sounds, such as traffic sounds, dogs barking, etc. In one aspect, user context may be determined based on one received characteristic. For example, user context may indicate the type of audio content that is being played back by the output device. As another example, the user context may be determined based on several characteristics. In which case, user context may be based on the type of audio content that is being played back and the location at which the user is listening to the content. Returning to the commuter example, the engine 30 may determine the context of which the user is using the output device as the user listening to a particular song (or genre of songs) while riding on a train to work.

In one aspect, the engine may store data in memory based on the determined context. For example, upon determining that there is traffic noise in a noisy environment, where the environmental noise level may be above a threshold, the engine may store data, along with user behavior (e.g., whether the user increased or decreased the volume setting) in a table in data 33. In one aspect, aggregating context-like data together may be used by the volume model 32 to better estimate an adapted volume setting when the output device encounters a similar situation.

As described thus far, the engine 30 may store received data while the output device is in an on-state. In another aspect, the engine 30 may store received data while the output device is in an "off-state", such as while the device is stored within the case 38. Again, in the case of the output device being a headset, the device may be in an off-state when not worn on the user's head and/or when the headset is not performing one or more operations, such as playing back audio content. In the case in which the output device 15 is an in-ear headset, the controller 24 may be configured to produce data, as described herein, and store the data into memory as a user wears the in-ear headset.

The volume model 32, which may be stored in memory 27, may be configured to generate a target volume setting, which is adapted to a context of the output device, based on the historical context/behavior data 33. In particular, the volume model 32 may be trained using at least some of the historical data 33 in order to optimally predict (or estimate)

target volume settings based on future detected characteristics, such as changes to the environmental noise level within an environment of the output device. As a result, the historical data allows the volume model to be personalized for the user. In addition to being personalized for the user, the model may also be updated based on changes to user habits. For example, as the user changes listening habits, such as listening to audio content at lower volume settings, this data may be stored within the historical data, and periodically used to update the volume model. Thus, having the historical data stored in the device allows the volume model to dynamically update efficiently and effectively to changes in user habit and behavior.

In one aspect, the controller may abstain from using the volume model to determine a target volume setting until a sufficient amount of training data has been measured and stored in the historical data. In particular, the controller may determine (or gather) historical data, over a period of time, that indicates user behavior as user-adjustments to the volume setting of the volume control 19 in one or more user contexts (e.g., based on environmental noise levels), while audio data is played back through the speaker, and store the data on the output device. In one aspect, the controller may gather and store data until a sufficient amount of samples of characteristics are measured and stored. For example, the controller may gather a specific amount (e.g., threshold) of samples of at least some characteristics, such as environmental noise levels with respect to user-defined volume settings. In one aspect, the threshold may be between 50 samples and 200 samples. In another aspect, the threshold may be preferably 100 samples. Upon gathering a sufficient amount of training data, the controller may generate (or train) the volume model using the data, thereby personalizing the model for the user, as described herein.

The volume model 32 may be trained to adapt the volume setting 35 based on changes to one or more environmental characteristics and/or playback characteristics. For instance, the estimator 31 may detect a change to the environmental noise level (e.g., the in-ear noise level exceeding a threshold) based on one or more microphone signals, as described herein. This change may be a most recent in-ear noise level estimate. Upon detecting the change, the controller 24 may provide the last estimated characteristics to the volume model, such as the in-ear noise level, and the content level of the audio content that is being played back, and/or the last (or most recent) volume setting of the output device which in response may produce a target the volume setting as output. In one aspect, the content level may be an average content level of audio content (e.g., a LKFS value) over at least a portion of audio content.

As described herein, the model may include other characteristics as input, which may be used by the model to produce a target volume setting as output. In particular, the model may be trained based on various contexts, such that the model may generate an optimal target volume setting once the output device is in a future context. Returning to a previous example, the volume model 32 may be trained using characteristics associated with the commuter on the train. Once trained, the volume model may generate a target volume setting that adapts the volume level of the output device for when the commuter rides the train, or is in a similar context, such as riding any train.

In one aspect, the volume model may be configured to generate one or more volume curves 34 based on the historical context/behavior data 33 and store the curves in memory 27, and may use the curves to determine a target volume setting. Specifically, the model may be trained using the historical context/behavior data 33 to output the volume curve(s) 34, each of which may be a function of volume setting with respect to user context as a at least one characteristic. For instance, user context may be various (one or more) environmental noise levels. In which case, the volume model may be configured to retrieve, from memory 27 of the output device, historical data 33 that may indicate user behavior of at least some past user-adjustments to the volume control (e.g., that may be collected by the output device over a period of time) with respect to various environmental noise levels, such as over a past period of time, and may determine a target volume setting as output of a machine learning (ML) model responsive to the historical data as input. For instance, the ML model may generate a volume curve based on the input that may indicates one or more volume settings with respect to various noise levels using the historical data, and may use the generated volume curve to determine (or select) a volume setting, as described herein.

The volume model 32 may use the generated volume curves to determine the target volume setting. For instance, as described herein, the data 33 may include a data structure that associates one or more environmental noise levels with one or more historic volume settings as a volume curve. The model may retrieve one of the volume settings that may be associated with the changed environmental noise level. In particular, the volume model may retrieve a target volume setting that corresponds to the changed environmental noise level along a retrieved volume curve 34. As a result, the volume model may retrieve a target volume setting from the curve that is associated with an environmental noise level, which may be a current (or last) estimated environmental noise level by the estimator 31.

In one aspect, each of the volume curves may be generated by the volume model 32 to account for user behavior in various user contexts of the output device. Specifically, the volume model may be configured to generate different volume curves based on user behavior associated with environmental and/or playback characteristics stored within the historical data 33. For example, the volume model 32 may generate a different volume curve for different types of audio content, such as having a media curve for audio content played back by a media player application, a telephony curve of audio content during a call (e.g., a voice-only call, a voice over Internet protocol (VoIP) call, etc.) and having a VPA curve for playing back notifications of a VPA application. In which case, the volume model may retrieve data 33 from the memory 27 that may be associated with the different types of audio content and user behavior, such as various previous volume settings by the user while the user listened to the audio content and a measured environmental noise level associated with the previous volume settings.

In another aspect, the volume curves may be more granular. For instance, the volume model may generate a volume curve for adapting the volume setting while the user plays back movie soundtracks. In which case, the movie soundtrack volume curve may be a function of volume setting with respect to environmental noise level, which may account for user volume settings while listening to a movie soundtrack in environments in various noise levels. As another example, along with different volume curves for different types of audio content, the volume model may generate volume curves based on the location of the user while listening to the audio content. Returning to the commuter example, the volume model may use historical context/behavior data 33 of the user while the user rode the train (e.g., the volume setting of the output device, the location of the user, and the environmental noise level), and may produce a volume curve to define the volume setting of the output device, as the user rides the train to work.

In one aspect, the volume model 32 may be configured to generate one or more curve parameters in order to produce the volume curves 34. In particular, the volume model may use historical data 33, which may indicate past (user-defined) volume settings with respect to environmental noise levels, for example, to determine the curve parameters. Curve parameters may include volume setting thresholds that bound a volume curve within a volume setting range. The thresholds may include a maximum threshold that may be a maximum volume setting and a minimum threshold that may be a minimum volume setting to which the volume control may be adapted. In one aspect, the model may generate the max/min thresholds based on the highest and lowest, respectively, volume setting across one or more environmental noise levels. In particular, the thresholds may be the highest and lowest volume setting set by the user of the output device across the one or more environmental noise levels. In another aspect, the thresholds may be determined based on a median volume setting across one or more environmental noise levels. In some aspects, a threshold may be determined based on an average of one or more volume settings across one or more environmental noise levels. In another aspect, the max/min thresholds may be determined based on the content level of the audio content.

The volume model may generate an average SNR of the audio content as one or more slopes of a volume curve. A slope of the curve may indicate how the volume setting changes with respect to changes in the environmental noise level. To generate a slope, the volume model may average volume settings associated with one or more neighboring environmental noise levels. In one aspect, the slope may be defined using a portion of the historical data. For example, the volume model may generate a minimum volume setting based on historical volume settings across one or more low environmental noise levels, and may generate a maximum volume setting based on historical volume settings across one or more high environmental noise levels. To generate the slope, the volume model may average historical volume settings across one or more environmental noise levels that are between the low and high environmental noise levels.

In another aspect, the volume model may determine the adapted volume setting based on user context of the output device. For example, the engine 30 may be configured to determine the user context of the output device, such as a content type of audio content that is being played back by the output device. The volume model 32 may receive current user context and/or user behavior from the engine 30, and may retrieve the adapted volume setting based on the current user context and/or user behavior. As an example, data from the engine may indicate that the audio content that is being played back is of a particular type and that the user is at a particular location. Using this data, the volume model 32 may select a previously generated volume curve 34 that may be associated with that context. In particular, the selected volume curve may have been generated by the ML model to indicate the volume setting with respect to environmental noise, as the user plays back the type of audio content. The volume model may determine, using the selected curve, the volume setting associated with a current environmental noise level.

In another aspect, upon detecting a change in the environmental noise level, the volume model may be configured to retrieve the current content level (which may be an average content level over at least a portion) of the audio content that is being played back and the environmental noise level, and may determine whether a target volume setting is to be generated based on the levels. In particular, the volume model may determine whether the change to the environmental noise level is significant enough to be perceivable to the user, which may mask at least a portion of the audio content. For example, if the content level is high (e.g., above a threshold), then a small change to the environmental noise level (e.g., below the threshold) may not be perceivable to the user. As a result, the volume model may not adapt the volume setting based on the change to the environmental noise level. In one aspect, this determination is based on whether the content level is greater than the environmental noise level. In some aspects, the volume model may provide this result to the engine 30 in order to save it as historical data 33. In another aspect, the volume model may determine whether to adapt the volume setting based on whether the content level of the audio content is above a threshold, such as being above a maximum threshold of a volume curve. If so, the volume model may not generate a target volume setting that is greater than the content level, since doing so would exceed the maximum threshold.

In some aspects, the volume model 32 may use one or more volume curves 34 (or more specifically one or more curve parameters) and historical data to generate a target volume setting. For instance, the volume model may retrieve a slope of a previously generated volume curve, which may have been generated based on the current context of the output device, the (current) content level of the audio content, the last (or current) volume setting of the output device, and the last environmental noise level measured by the output device as input for generating the target volume setting. For example, the volume model may use the input to generate a volume curve, from which the volume model may select a target volume setting that is associated with the last environmental noise level, as described herein.

In one aspect, the controller 24 may be configured to store the target volume setting, the generated volume curve, and/or associated characteristics in the historical data 33. For example, the controller may store the changed environmental noise level, the target volume setting, any associated characteristics that indicate the context of the output device in the historical data, and/or generated volume curves (or curve parameters).

The volume setting 35 may be configured to receive the target volume setting from the volume model 32, and provide the target volume setting along with the current volume setting, e.g., the volume setting at which the volume control is set before the controller 24 adapts the volume, as described herein, to the ramp 36. In addition, the volume setting 35 may provide the target volume setting to the context & behavior engine 30, in order for the engine to store the generated target volume setting, along with the measured characteristics that were used by the volume model 32 to generate the setting in historical data 33. Such data may then be used, along with the already stored data, to update the model, as described herein.

The ramp 36 may be configured to receive the last volume setting and the target volume setting, and may be configured to ramp up or down the scalar gain 37, such that the gain that may be applied to an input audio signal either increases or decreases over a period of time from the last volume setting to the target volume setting. As a result, the playback of the audio content may be adjusted by transitioning the last volume setting to the target volume setting. In particular, the applied gain 37 to the audio signal either increases or decreases a signal level of the audio signal over a period of time from a starting signal level to an ending signal level. As an example, when the volume level associated with the last volume setting may be −40 dB, and the volume level of the target volume setting may be −20 dB, the ramp 36 may ramp down the attenuation of the audio signal by the scalar gain 37 by 20 dB over a period of time (e.g., one second, two seconds, three seconds, etc.). In which case, the gain may be applied as a function of time, as opposed to adjusting the gain stepwise, which may be the case when the user changes the volume setting by adjusting the volume control. The ramping of gain may be better than adjusting the gain stepwise, since the adapted volume control may be performed without user intervention. As a result, the volume level may be increased gradually to provide a better user experience, as opposed to an abrupt volume change that would otherwise be the case when the gain is increased in a stepwise fashion.

In one aspect, the period of time may be a ramp rate at which the ramp either ramps up or down the scalar gain 37. In one aspect, the ramp rate may be predefined. In which case, the ramp 36 may retrieve the ramp rate from memory. In one aspect, the ramp may select a ramp rate from several ramp rates stored in memory, based on various criteria. For example, the ramp 36 may be configured to determine the ramp rate to increase or decrease the gain based on the user context or the user behavior, as described herein. For instance, the memory may include different ramp rates based on the different context at which the output device is playing back audio content. For example, memory 27 may include a ramp rate associated with media content, while having a different ramp rate for VPA audio content.

In one aspect, the ramp rate may be adjustable or updatable by the controller 24. As described herein, the ramp rate may be associated with the amount of time it takes to increase or decrease the volume from an initial volume setting to a new volume setting. This rate may be based on user-adjustments to the volume control 19. In particular, the controller may adjust, or update ramp rates based on historical data 33 that indicates user-adjustments to the volume control. The controller may monitor how fast and/or how often a user-adjustment to the volume control is received. For example, the controller may monitor how fast the user adjusts the volume setting by measuring the period of time from an initial volume setting to a final user-adjusted volume setting. The controller may base the ramp rate on this period of time. In another aspect, the controller may be configured to update the ramp rate based on whether a user-adjustment of the volume control 16 is received while the volume setting is being ramped up or ramped down. More about adjusting the ramp rate is described herein.

As described herein, the controller may be configured to adapt the volume setting using the volume ML model 32, which may be configured to decide whether or not to adapt the volume setting based on various criteria. In one aspect, the ML model may be any type of machine learning model, such as a convolution neural network, which may have an objective function for updating the volume setting of the output device with a minimal amount of user intervention (e.g., with minimal or no user-adjustments to the volume control 19).

In one aspect, the controller 24 may be configured to update the ML model 32 based on new (or newer) data that may be stored within the historical data 33. For example, the controller may be configured to continuously (or periodically) store new context/behavior data in memory 27, and may be configured to update the volume model using the historical data 33 that may have old data and new data as training data. For instance, as described herein, the context & behavior engine 30 may receive the target volume setting, and store the setting with one or more characteristics in the data 33, as described herein. The controller may be configured to update the volume model 32 based on the updated data 33. As a result, the volume model 32 may be constantly updated based on changes to user context and/or user behavior in order to maximize its objective function. As described herein, one or more volume curves 34 may be updated when the volume model is updated.

In one aspect, the volume model 32 may include a reinforcement learning or adaptive framework that may update the volume model based on user action or inaction, while the ML model 32 performs adaptive volume control operations. As described herein, the model's objective function may be to minimize user intervention (or actions) based on changes to the environment, such as varying environmental noise levels. As a result, the volume model 32 may be configured to monitor the volume setting 35 (e.g., for a period of time) after adapting the volume setting to determine whether a user-adjustment to the volume control occurs, which may indicate that the adapted volume setting is an undesirable setting for the user. Upon determining that the user has adjusted the volume control, the volume model may be configured to be updated in order to take into account the user's adjustment. More about updating the volume model is described herein.

In one aspect, the output device 15 may provide data to the source device 14, in order for both devices to reflect the most up-to-date volume setting. This may ensure that both devices reflect the same volume setting so that if the user adjusts the volume setting at volume control 16 of the source device, the change is accurately detected by the controller 24. This may ensure that changed volume settings are accurately depicted in the historical data 33. Thus, the output device may be configured to transmit (e.g., over a wireless connection, such as a BLUETOOTH connection) the target volume setting (from the volume setting 35) to the controller 20, which may store the setting in memory. In addition, the output device may transmit the ramp rate at which the controller 24 is to ramp up or down the volume level. In addition, the source device 14 may transmit a control signal (e.g., over the BLUETOOTH connection) that indicates a user-adjustment to the volume of the output device has been received through the volume control 16. In response, the volume setting 35 may adjust the volume level based on the user-adjustment. In which case, the controller 24 may perform a stepwise adjustment from a previously set volume setting. In addition, the volume setting 35 may provide the user-adjustment to the engine 30 to be stored, along with one or more characteristics, in the historical data, as described herein.

In another aspect, the source device 14 may be configured to provide (or stream) the audio content to the output device 15. In which case, the input audio source 132 may be a part of the source device.

Figure 4:
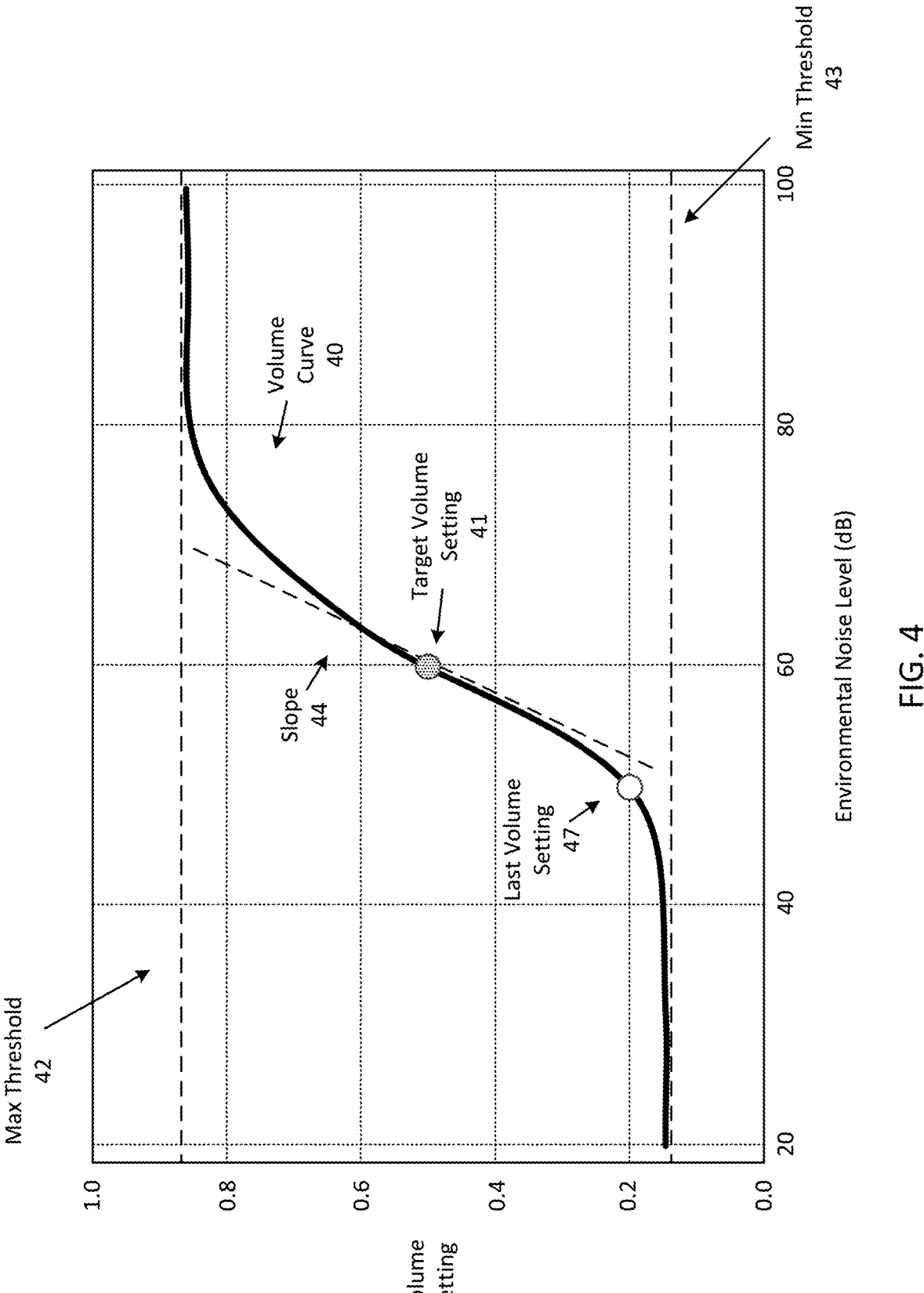
FIG. 4 illustrates a volume curve that may be used to adapt a volume setting for a given environmental noise level according to one aspect.

FIG. 4 illustrates a volume curve 40 that may be used to adapt a volume setting based on one or more environmental (and/or playback) characteristics according to one aspect. The volume curve is a function of volume settings of the volume control 19, which may go from "0.0", being the lowest volume setting to "1.0", which may be the highest volume setting, with respect to environmental noise level in dB. As shown, the volume curve is a non-linear curve, or more specifically a sigmoid curve. Illustrated with the curve are several curve parameters. For instance, as shown, the curve 40 is bounded by a minimum volume setting threshold 43 of approximately 0.16 and a maximum volume setting threshold of approximately 0.88. In one aspect, the thresholds provide boundaries such that the system 10 may not exceed a volume setting that may be undesirable for the user. Thus, in this case, the volume curve 40 may define volume settings within a range of volume settings that are within a full volume setting range of the volume control, going from 0.0 to 1.0. In addition, a slope 44 of the curve is shown, where the slope indicates the movement of the curve from the minimum threshold 43 to the maximum threshold 42. As described herein, these parameters may be updated as the user uses the output device. This may allow the system to adapt to the user's changing listening habits.

In one aspect, the curve may be any type of non-linear curve, which may include multiple curve parameters, such as having multiple slopes. In another aspect, the volume curve 40 may be a linear curve.

In one aspect, the curve represents various volume settings for the output device based on different noise levels. For example, the curve shows the last volume setting 47, which is 0.2 at a noise level of approximately 50 dB, and shows a target volume setting 41 of approximately 0.5 at a noise level of 60 dB. In this case, the volume model 32 may have received an indication that the noise level has increased by 10 dB, which may be due to the user moving from a quiet location to a louder location, and then based on the new noise level may select the volume setting 41 of the curve 40 that is associated with 60 dB.

In another aspect, the generated volume curve 40 may be a function of volume setting with respect to another characteristic determined by the controller 24.

FIGS. 5-8, and 12 are flowcharts of processes 50, 60, 70, 80, and 120, respectively, for performing one or more digital (e.g., audio) signal processing operations, adaptive volume control operations, and/or network operations. In one aspect, at least some of the operations may be performed by one or more devices of the system 10. For instance, at least some of the operations of processes may be performed by the controller 24 of the output device. In another aspect, at least some of the operations may be performed by the controller 20 of the source device 14.

Turning to FIG. 5, this figure is a flowchart of one aspect of a process 50 for adapting volume control using the volume model 32, and storing historical data 33, which may be stored in memory of the output device 15. In one aspect at least some of these operations, such as playing back the audio content, may be performed while the output device is in an on-state (e.g., once or while the output device is donned on the user's head, when the output device is a headset). The process 50 begins with the controller 24 playing back audio content through a speaker of an output device at a volume setting (at block 51). As described herein, the audio content may be user-desired audio content, such as a musical composition that may be played back through a media player application that may be executing on the output device, or may be executing on the source device 14. In that case, the output device may receive the audio content (e.g., over a wireless network), as one or more audio signals, and may playback the audio content at the volume setting by applying one or more gains to the audio signals according to the volume setting, and driving the speaker of the output device with the gain-adjusted audio signals. Thus, the audio content may be played back at a volume setting that may define an output volume level of the audio content.

The controller 24 (optionally) determines one or more playback characteristics of the output device 15 (at block 52). In particular, the controller may determine, while audio content is being played back, one or more characteristics, such as a content level (e.g., a loudness value) of the audio content. In addition, the controller 24 may determine a current (or last) volume setting of the output device. In another aspect, the controller may determine other characteristics, such as a type of audio content that is being (or to be) played back, such as whether the audio content is media audio content. In this case, the characteristics may indicate descriptive information of the media audio content. For example, the descriptive information may indicate what type of media, such as a movie soundtrack or a musical composition. When the type is a musical composition, the information may include the title of the musical composition, the genre, etc. In another aspect, the controller may determine how the user is listening to the audio content, such as a location of the user, a time, a destination of the user, etc., as described herein.

The controller 24 receives one or more microphone signals captured by one or more microphones (at block 53). For instance, the controller may receive a microphone signal that includes ambient noise of an acoustic environment from the reference microphone 28 of the output device and/or a microphone signal that includes sound from within (or near) the user's ear from the error microphone 29 of the output device.

The controller 24 determines one or more environmental characteristics of the acoustic environment based on the one or more microphone signals (at block 54). For example, the controller may determine (or detect) the environmental noise level within the ambient environment. In one aspect, the noise level may include the in-ear noise level. In which case, the controller may use at least a portion of a reference microphone signal captured by the reference microphone to determine the in-ear noise level. For instance, the controller may determine the in-ear noise level by taking into account the audio processing mode in which the output device is operating to determine a level of attenuation of the output device, and then may produce the in-ear noise level (e.g., as a dBA value) based on the reference microphone and the mode. In another aspect, the controller may determine the in-ear noise level based on the error microphone signal.

In another aspect, the controller 24 may determine other environmental characteristics. For example, the controller 24 may use the reference microphone signal to determine whether there are certain sounds of the environment that may have been captured by the microphones, such as speech of a person.

The controller 24 determines whether the volume setting should be adapted to the environment (at decision block 55). In particular, the controller 24 may determine whether there is a change (e.g., above a threshold) to one or more environmental noise characteristics, such as a measured environmental noise level of ambient noise within the environment captured by one or more microphones. For example, the controller may determine whether a measured noise level within the acoustic environment has increased or decreased from a previous measurement. If so, the controller determines, using the volume model 32, a target volume setting (at bock 56). In particular, the controller may retrieve a target volume setting by using the volume model 32 to produce the target volume setting based on the (e.g., changed) environmental noise level and/or one or more determined characteristics. For instance, the volume model 32 may generate a target volume setting based on one or more characteristics as input into the model. For example, the controller may input the latest (e.g., changed) environmental noise level (e.g., in-ear noise level), the (average)

content level of the audio content, the last (or more recent) volume setting into the model, and/or other characteristics or curve parameters, such as a slope of a previously generated volume curve, and in response the volume model may generate the target volume setting based on the input. Thus, a new volume setting to adapt to the environmental noise level may be output of the volume model. In one aspect, to determine the target volume setting, the volume model may retrieve a volume curve 34 from memory 27 and may determine the target volume setting that may be associated with the latest environmental characteristic, as described herein.

In another aspect, the volume model may determine the target volume setting based on other inputs, such as other environmental and/or playback characteristics. As described herein, the additional input data may allow the volume model to provide a more specialized volume estimate for a particular context of the output device.

The controller 24 adjusts playback of the audio content by transitioning the (last) volume setting to the target volume setting (at block 57). Specifically, the controller adapts the existing volume setting to the target volume setting. As described herein, the controller 24 may ramp up or ramp down the last volume setting to the target volume setting. In particular, the controller 24 may transition, without user intervention, from the last volume setting to the target volume setting such that the output volume level of the audio content is either ramped up or ramped down to a new output volume level associated with the new volume setting over a period of time. More about ramping is described herein. The controller stores the characteristics and/or adapted volume setting as historical context/behavior data in memory of the output device (at block 58). For instance, the controller may store the last volume setting, the target volume setting, and the environmental noise level, and other data/characteristics into data 33, which may be used to update the volume model 32, as described herein.

Returning to decision block 55, if, however, it is determined that the volume setting is not to be adapted, the controller 24 continues to playback the audio content at the volume setting (at block 59). For instance, if the environmental noise level has not changed greater than a threshold, such as the content level of the audio content, such as the user may have moved between environments with similar noise levels, the system determines that the best course of action is to maintain the current volume level. In this case, the controller may store the determined characteristics and the current (or non-adapted) volume setting in memory of the output device at block 58.

As described herein, the controller may determine a target volume setting based on the context in which the user is using the output device. For example, the volume model may generate a target volume setting for a particular type of audio content, such as media content. In particular, the volume model may be trained to generate a volume setting to compensate for changes to the environmental noise level while the user is listening to the media content. In another aspect, the controller may determine one or more target volume settings based on one or more contexts. For example, the volume model may determine several target volume settings based on the change to the environmental noise level, each associated with a different context, such as a target volume setting for the media content, a target volume setting for VPA audio content, and a target volume setting for telephony audio content. Each target volume setting may be an optimal volume setting for the change to the environmental noise, while that type of audio content is being played back. In one aspect, this may allow the controller 24 to adapt volume settings as the user changes the audio content that is being played back. For example, the controller may determine a first target setting for media content that is being played back and a second target setting for VPA audio content. At a later time, the user may interact with the VPA application, which as a result will playback VPA audio content. In which case, the controller 24 may adapt the volume setting to the second target volume setting while playing back the VPA. This may allow the output device to adapt the volume setting for changes in the context in which the user is listening to the output device.

As described herein, the output device may transmit data relating to the target volume setting to the source device 14. For example, the output device may transmit the target volume setting and the ramp rate at which the volume level is adjusted. In one aspect, the output device may transmit other data, such as other target volume settings that are generated, as described herein. In another aspect, the output device may transmit determined characteristics to the source device, which may store the characteristics (and/or other data) as historical data on the source device.

Figure 6:
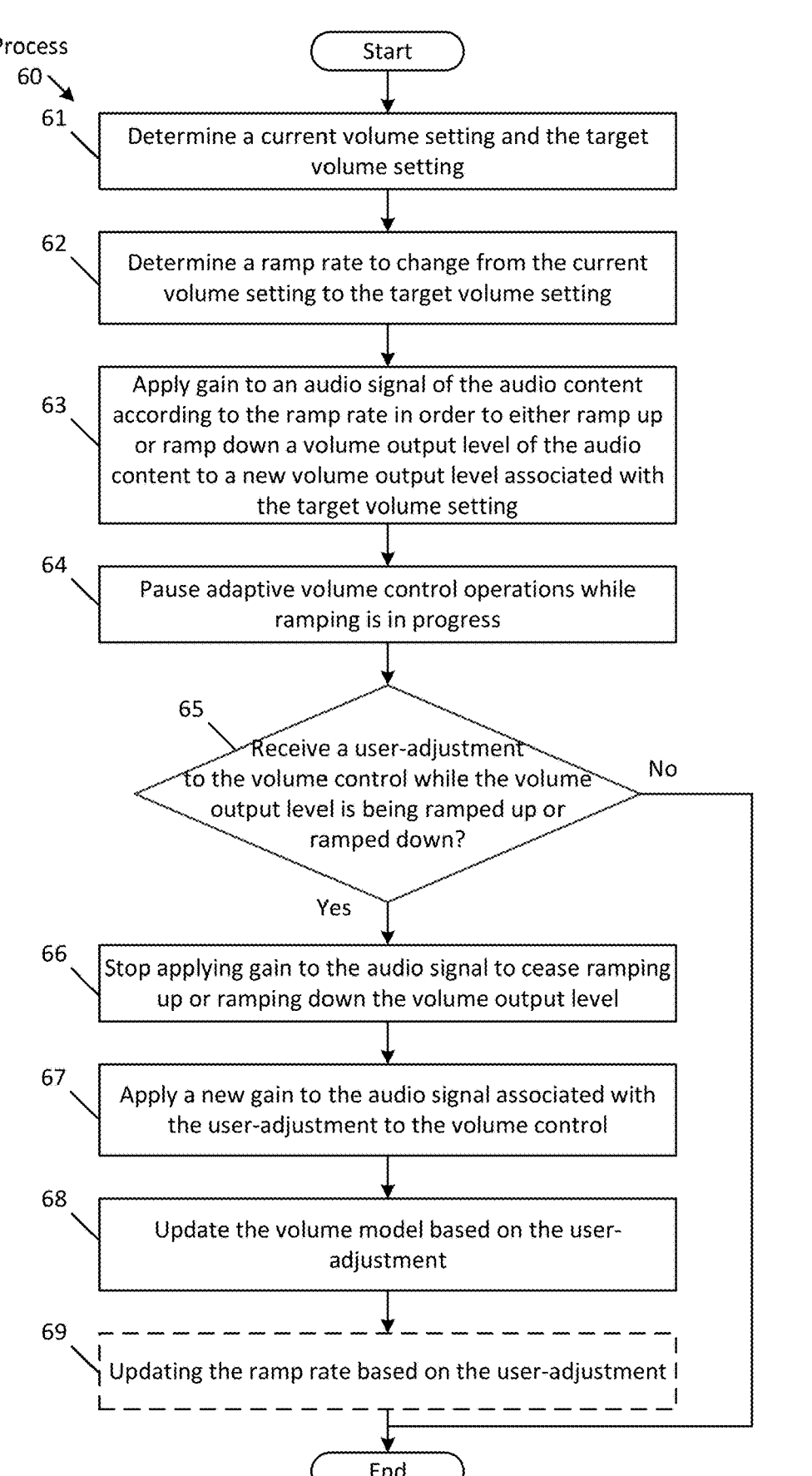
FIG. 6 is a flowchart of one aspect of a process for ramping volume up or down based on an adapted volume.

FIG. 6 is a flowchart of one aspect of a process 60 for ramping volume up or down based on a target volume. In particular, at least some of the operations may be performed by the (e.g., ramp 36 of the) controller 24 to adjust the volume setting of the output device 15. The controller 24 determines a current (or last) volume setting and the target volume setting (at block 61). For instance, the volume setting 35 may provide both settings to the ramp 36. The controller 24 determines a ramp rate to change from the current volume setting to the target volume setting (at block 62). For instance, the controller may retrieve the ramp rate from memory 27. In one aspect, the ramp rate may be predefined. In another aspect, the ramp rate may be based on one or more playback and/or environmental characteristics. For example, the memory may include different ramp rates for different playback characteristics, such as having different ramp rates for different types of audio content. In which case, the controller may determine the type of audio content that is to be played back, and may retrieve the ramp rate associated with the determined type. In another aspect, the ramp rate may be provided by the volume setting to the ramp 36.

The controller 24 applies gain to an audio signal of the audio content according to the ramp rate in order to either ramp up or ramp down a volume output level of the audio content to a new volume output level associated with the target volume setting (at block 63). For example, the ramp rate may indicate that gain is to increase by 6 dB per second. In which case, when the new volume setting is 20 dB higher than the last volume setting, the applied gain may be increased by 20 dB in approximately three seconds. The controller pauses adaptive volume control operations while ramping is in progress (at block 64). In particular, the controller may pause the volume model from receiving data and/or producing a new target volume setting while the volume level of the output device is ramped up or down. This may ensure that the volume does not abruptly change due to changes in the environment, for example, which may adversely affect playback. For example, if the environmental noise level were to suddenly drop, while the volume setting is being ramped up, the volume model may produce a new target volume setting that is considerably less than the previous. As a result, if applied while ramping, the volume level may suddenly and dramatically drop. Thus, the controller may pause the operations until the ramping has ceased (e.g., either due to the ramping being completed or the ramping being interrupted, as described herein).

The controller 24 determines whether a user-adjustment to a volume control, such as control 19 of the output device 15 or control 16 of the source device 14 has been received, while the volume output level is being ramped up or ramped down (at decision block 65). Returning to the previous example, the controller determines whether a user-adjustment to the volume control has been received within the three seconds in which the gain has been increased 20 dB. User-adjustments may be received during this time for various reasons. For example, the user may wish to speed up the increase in volume, but manually selecting the volume control (volume-up button), or the user may wish to stop or turn down the increasing volume level, by selecting a volume-down button, for example.

If so, the controller 24 stops applying gain to the audio signal to cease ramping up or ramping down the volume output level (at block 66). For instance, in the case in which a user-adjustment is received after one second, the controller may stop increasing such that the gain has only increased by 6 dB, as opposed to 20 dB. The controller applies a new gain to the audio signal associated with the user-adjustment to the volume control (at block 67). In particular, the new gain may be applied to the existing increased gain in order to increase the volume level. For example, when the last volume setting was associated with a volume level of −60 dB, and the current volume level is −54 dB, the volume level may be increased by a particular gain, such as 10 dB, resulting in a −44 dB. In one aspect, the new gain may be applied stepwise, meaning that the volume is not ramped up from −54 dB to −44 dB, but instead switches (e.g., instantaneously) to −44 dB.

The controller 24 updates the volume model based on the user-adjustment (at block 68). For example, as described herein, the volume model may be trained to generate a volume curve. In which case, the model may generate volume parameters, such as a slope that may indicate the rate at which the volume setting is increased with respect to the environmental noise level. The volume model may be configured to update one or more volume parameters, such as the slope when a user-adjustment to the volume control is received while the volume is ramped up or down. For example, the slope may increase, meaning that the rate of volume setting change with respect to environmental noise level may increase when the user interrupts the ramping up to increase the volume, since this may indicate that the user wishes the volume to increase faster with respect to the change in noise. As a result, upon detecting similar (or the same) context in the future, the updated volume model may generate a different target volume setting, which may be similar or the same as the user-adjusted volume setting than if the volume model was not updated.

The controller (optionally) updates the ramp rate based on the user-adjustment (at block 69). In particular, the controller 24 may be configured to adjust the ramp rate based on whether a user-adjustment is received while ramping by the ramp 36 is in progress. In this case, the volume control 19 may receive, while the ramp 36 is in progress, e.g., during the period of time it takes for the ramp rate to go from the last volume setting to the adapted volume setting, a user-adjustment. Such may be the case when the user of the output device wishes the volume to increase or decrease faster than the ramp rate. In response, the volume setting 35 may increase (e.g., by a stepwise amount), based on the user adjustment. In particular, the controller may change the adapted volume setting at which the volume setting 35 has been set to a changed volume setting based on the user-adjustment, which may adjust the scalar gain 37 accordingly. In addition, the controller 24 may be configured to update the ramp rate. For instance, the controller may update the ramp rate based on a time interval between the adjusting of the playback, such as a moment in time when the ramp 36 began to increase or decrease the scalar gain 37 and the receiving of the user-adjustment. Such may be the case when the user-adjustment is to increase the output volume level while the gain is ramped up. In one aspect, the controller 24 may (optimally) update the historical data 33, as described herein.

Figure 7:
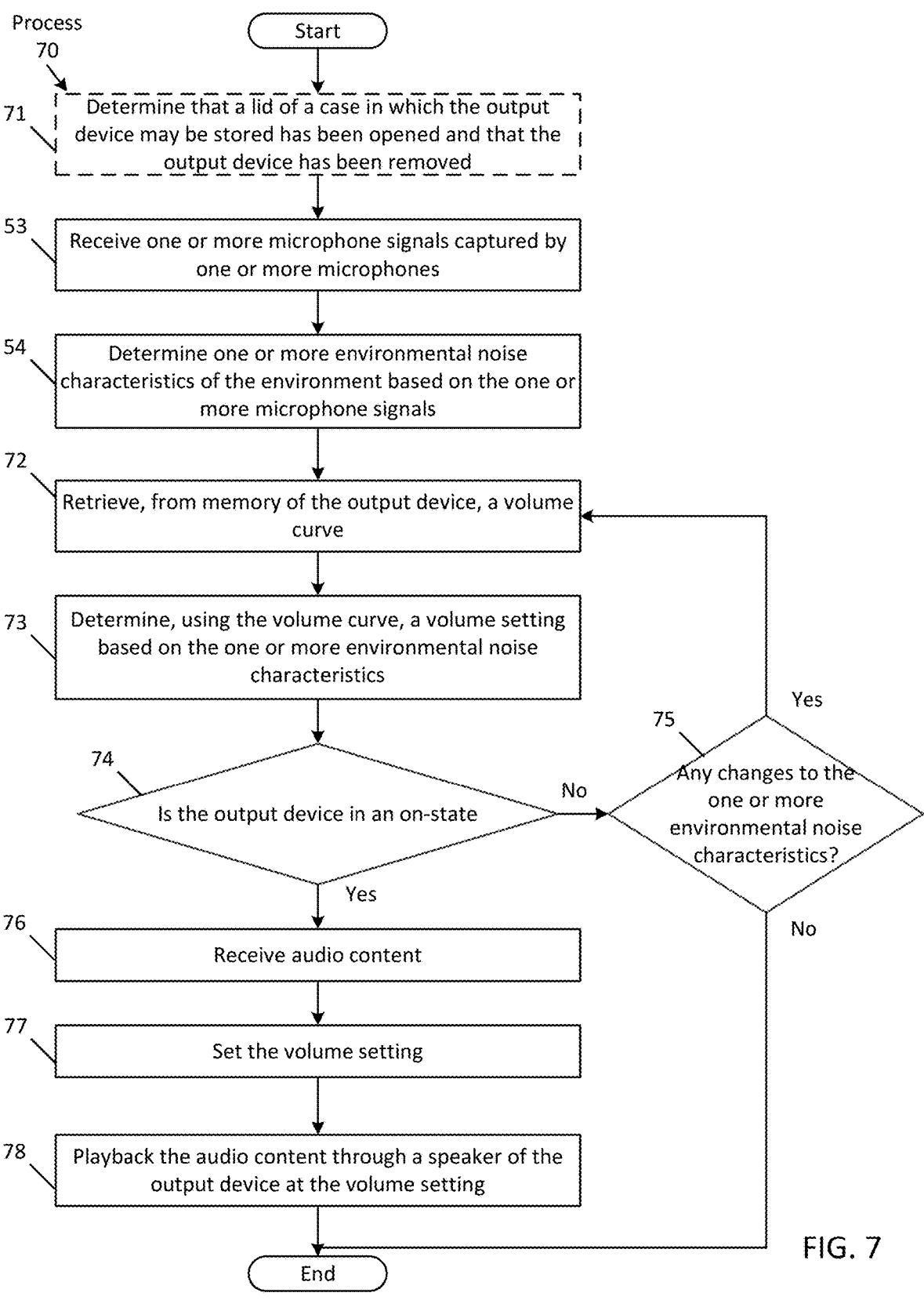
FIG. 7 is a flowchart of one aspect of a process for adapting volume control prior to audio playback of the output device.

In one aspect, the adaptive volume control operations described thus far may be performed by the system 10 while the output device is in an on-state. In particular, the output device 15 may perform the adaptive volume operations while playing back audio content. In another aspect, however, the system 10 may adapt the volume control while the output device is in an off-state, such as while the device is within the case 38 or once the device is removed from the case, but before the output device is used by a user. FIG. 7 is a flowchart of one aspect of a process 70 for adapting volume control while the output device 15 is in the off-state.

The process 70 begins by the controller 24 of the output device 15 (optionally) determining that a lid 39 of the case 38 in which the output device may be stored has been opened and that the output device has been removed (at block 71). For instance, the controller 24 may include one or more sensors, which may be a part of sensors 45, that are arranged to detect whether the lid is opened, while the output device is housed within the case and/or that are arranged to detect whether the output device has been removed from the case. In particular, the sensors 45 may include one or more proximity sensors that are arranged to detect the presence of the lid, based on the lid is within a threshold distance, and upon determining that the lid is not within a threshold distance that the lid has been moved and/or opened.

As described herein, the operations at block 71 may be optional. Instead, the controller 24 may be configured to determine whether the output device is in an off-state. For example, the controller may determine whether the output device is being used by a user based on sensor data. When the output device is a headset, the controller may receive sensor data that indicates whether or not the device is worn on the head of a user. Again, the sensors 45 may include a proximity sensor that is arranged to detect whether the headset is being worn (based on whether proximity sensor data indicates that an object, such as a user's head, is within a threshold distance).

The controller 24 receives one or more microphone signals captured by one or more microphones (at block 53), and determines one or more environmental noise characteristics of the environment (e.g., an environmental noise level) based on the one or more microphone signals (at block 54). The controller 24 retrieves, from memory of the output device, a volume curve (at block 72). For instance, the volume curve may be predefined. In particular, the volume curve may be a default volume curve (e.g., stored within memory by a manufacturer of the output device). Such may be the case when the output device is activated (or powered-on) for the first time, where the memory of the output device may not include or may have very little historical data associated with the user of the device. In another aspect, the volume curve may be a personalized volume curve for a user of the output device that may have been generated by the volume model 32 at an earlier time, such as the last time the output device was in an on-state, and stored in memory. In particular, as described herein, the volume model 32 may have generated the personalized volume curve as output based on historical context and behavior data 33 of the user of the output device, stored in memory 27, as input into the model.

In another aspect, the controller 24 may select a volume curve based on one or more other characteristics. For instance, the controller may be configured to determine one or more playback characteristics, such as determining a location of the output device. In which case, the controller may select a volume curve associated with volume settings that may be used at that determined location. This may allow the system 10 to better personalize selected volume settings for different locations.

The controller 24 determines, using the volume curve, a volume setting based on the determined environmental noise characteristics (at block 73). For instance, the volume curve may associate volume settings with environmental noise levels, and therefore when the noise characteristic is a last environmental noise level measured by the output device, the controller 24 may select a volume setting associated with the last environmental noise level. Thus, responsive to determining that the lid of the case has been opened, the controller may determine an environmental noise level (based on a captured microphone signal), and may retrieve, from memory of the output device, a volume setting based on the noise level (e.g., using the volume curve, as described herein). In another aspect, the controller 24 may determine the volume setting as output of the volume model 32 in response to input of one or more characteristics, as described herein. In which case, the model may predict the volume setting based on the determined (or known) characteristics.

The controller 24 determines whether the output device is in an on-state (at decision block 74). For instance, when the output device is an in-ear headset, the controller may determine whether the headset has been inserted into the user's ear. In addition, the controller 24 may determine whether the output device is to playback audio content, such as by receiving an indication from the input audio source 132 (e.g., receiving one or more audio signals from the source). If not, meaning that the output device may be in an off-state, the controller 24 determines whether there have been any changes to the one or more environmental noise characteristics (at decision block 75). For instance, the controller 24 may continue to monitor the environmental noise level of the environment based on one or more microphone signals. If the environmental noise level has changed, such as by a threshold, from the previously measured environmental noise level, the controller 24 may return to block 72 in order to determine whether the volume setting is to be updated based on the changes to the environment. In another aspect, this decision may also take into account other characteristics that may be monitored by the controller, as described herein.

Returning to decision block 74, if, however, the output device is in an on-state, the controller 24 receives audio content (at block 76). For instance, the system 10 may receive user input, indicating a user's desire to playback the audio content. In one aspect, the user input may be received by the controller 24 via one or more controls of the output device. In response, the controller 24 may retrieve an audio signal that includes the audio content from the input audio source 132. The controller 24 sets the volume setting (at block 77). Specifically, the volume model 32 of the controller 24 sets the volume setting 35 to the determined volume setting. The controller 24 plays back the audio content through a speaker of the output device at the volume setting (at block 78). In this case, the controller may apply a gain 37 based on the set volume setting 35 to an audio signal of the audio content. As described herein, the controller 24 may set the volume setting once the output device is in the on-state. In another aspect, the controller may set the volume setting once the volume setting is determined from the volume curve. As a result of determining the adapted volume setting based on the environment and before the output device is in an on-state, the volume level during the initial playback of audio content may be at a comfortable volume level for the user.

As described herein, the volume model may be configured to generate multiple target volume settings based on a current context of the output device. Similarly, the controller may determine several volume settings using several stored volume curves at block 73. In which case, upon receiving the audio content, the controller 24 may be configured to determine the context of the output device, such as what type of audio content is being received. In which case, the controller may select the target volume setting from the several target volume settings to be used for playback of the audio content.

Figure 8:
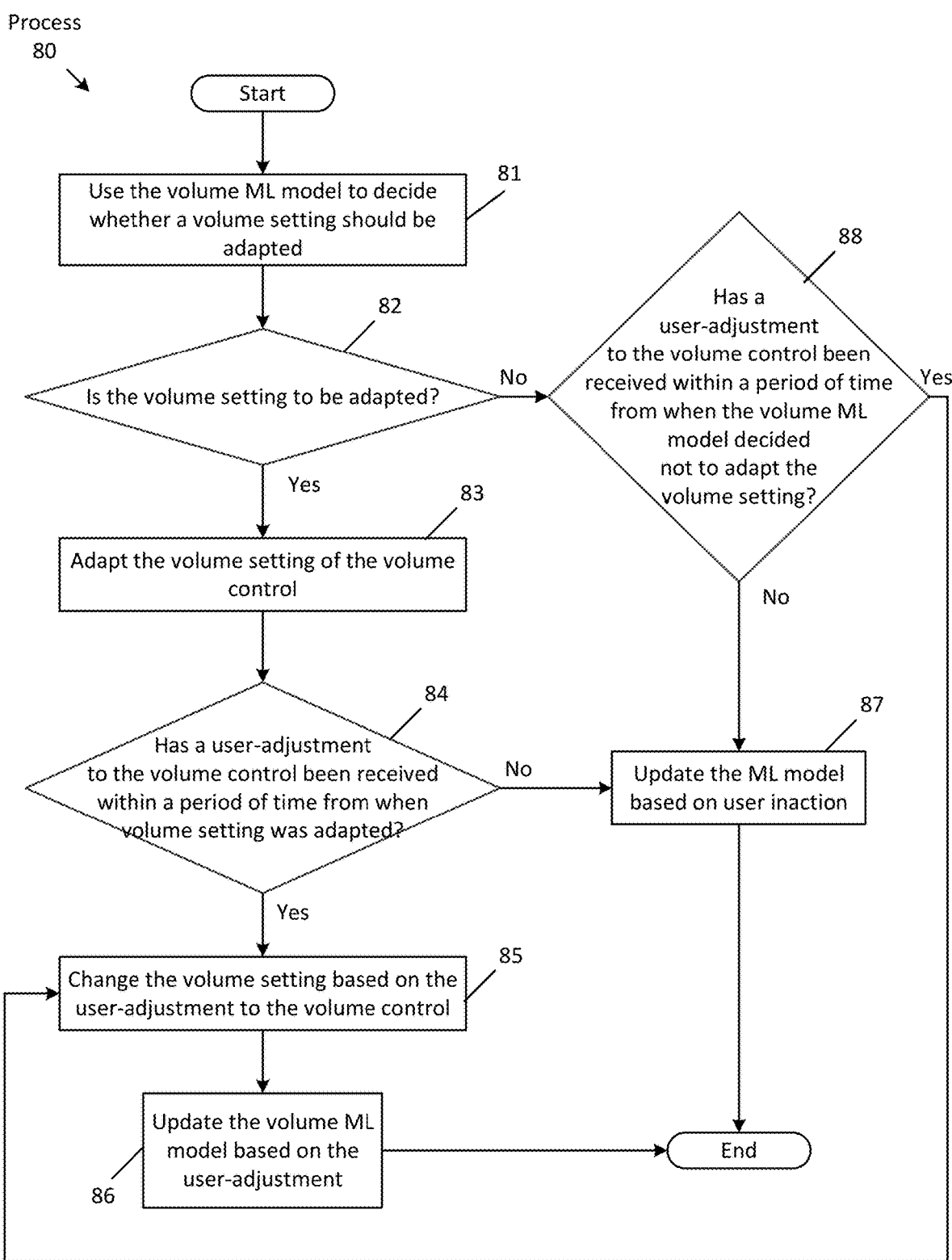
FIG. 8 is a flowchart of one aspect of a process for updating the ML model based on whether a user has adjusted the volume control.

FIG. 8 is a flowchart of one aspect of a process 80 for updating the volume model 32 based on user action or inaction. Specifically, the operations described in this process 80 describe how the volume model 32 may be updated responsive to user feedback, which may be positive feedback in which a decision by the model is accepted or approved by a user or may be negative feedback in which the decision by the volume model may be rejected by the user. In one aspect, the user may reject a decision by performing one or more actions, such as adjusting the volume control, while the user may accept a decision due to an in-action (e.g., by the user not adjusting the volume control when the volume model generates a target volume setting that is used to adapt the volume of the output device).

In one aspect, the model may be updated by retraining the model with at least some old data (e.g., historical data 33) and/or new data in order update model weights (or parameters) according to the new data. In another aspect, one or more volume curves 34 that are stored in memory 27 may be updated when the model is updated. For instance, the model may recreate new volume curves each time new data is used to train the volume model in order to further optimize the curves according to the new data. In which case, the model may use at least some of the curve parameters, such as slopes, max/min thresholds, etc., as input into the model, along with other historical data, in order to update at least one of the curve parameters.

In one aspect, the operations of process 80 may be performed by the controller 24 while audio content is being played back to a user of the output device. As described herein, the volume model 32 may be any type of ML model that may be trained using at least some of the historical data 33 stored in memory to determine a target volume setting based on one or more criteria. In particular, the model may be a reinforcement learning model that may be trained to determine whether to take an action of adapting the volume setting of the volume control based on one or more playback and/or environmental characteristics. Such a model may have an objective function of minimizing user intervention, whereby the model may be updated based on (e.g., positive and/or negative) feedback from the user in order to optimize the objective function. As described herein, feedback may be based on user action or user in-action that may be received while the model performs adaptive volume control operations. Thus, by optimizing the model based on feedback of a user of the output device, the model may be personalized for the user of the output device. For instance, the model may learn user preferences, such as the volume setting, based on the context of the output device (based upon which the model may be trained, as described herein).

The process 80 begins with the controller 24 using the volume model 32 to decide whether a volume setting should be adapted, to the environment for example (at block 81). For instance, the model may receive a last environmental noise level, a last volume setting, and/or may receive one or more other characteristics described herein as input, and may either generate a target volume setting as output or may determine that the last volume setting may be the most optimal volume setting based on the input. As described herein, this decision may be based on the content level of the audio content with respect to the environmental noise level. As another example, this decision may be based on whether a volume curve generated by the model associates the last environmental noise level (e.g., within a threshold) with the last volume setting. In other words, determining that the environmental noise has not changed sufficiently enough to generate a new adapted volume setting.

The controller 24 determines whether the volume setting is to be adapted based on the decision made by the model (at decision block 82). If so, the controller adapts the volume setting of the volume control (at block 83). In particular, the volume setting 35 may be adapted to the generated target volume setting by the model. In which case, when the controller 24 is playing back audio content, it may be adjusted by transitioning the last volume setting to the target volume setting. As described herein, the controller may ramp up or down the volume of the audio content from the last volume setting to the new, target volume setting over a ramp rate. The controller 24 determines whether a user-adjustment to the volume control has been received within a period of time from when the volume setting of the volume control was adapted (at decision block 84). In particular, the controller determines whether the target volume setting is an optimal volume setting for the user based on whether a user action of a volume adjustment has been received. In one aspect, this determination may be made from when playback of the audio content was adjusted. For example, the period of time may be from when the controller 24 began to ramp up or down the volume setting to the target volume setting, as described herein.

If so, meaning that a user-adjustment at a volume control has been received to adjust the target volume setting, the controller 24 changes the volume setting based on the user-adjustment to the volume control (at block 85). For example, the controller may change the volume setting 35 and adjust the gain 37 applied to an audio signal of the audio content according to the changed setting, as described herein. For instance, the controller may perform a stepwise increase of the volume level based on the user-adjustment to the volume control. The controller 24 updates the volume model based on the user-adjustment (at block 86). In particular, the controller may update the volume mode based on one or more current environmental characteristics and/or playback characteristics and/or based on the user-adjustment, such that, responsive to detecting future changes to environmental and/or playback characteristics, the updated volume model may produce a different target volume setting than would otherwise be produced by the volume model before being updated. For example, if the target volume setting by the model was too high for the user, the user may turn down the volume setting via the volume control. In response, the volume model may be updated to account for the user's reduction of the volume setting, such that when a future target volume setting is generated it may account for the reduction (e.g., by being less than the previously generated target volume setting). As another example, the updated model may include an adjusted (or updated) volume curve (e.g., updated one or more curve parameters) that accounts for (based on) the adjusted volume setting. For example, as described herein, the updated model may adjust the curve slope based on the user-adjustment.

Returning to decision block 84, if, however, no user-adjustment has been received (within the period of time), the controller may update the model based on user inaction (at block 87). As a result, the model may update model parameters to indicate that the policy taken by the model, by adapting the volume setting due to the environment and/or environmental changes, is more optimal than otherwise not taking the action of adapting the volume. In particular, determining that the user has not changed the volume setting may indicate that this is a user-desired volume setting, which may be used to reinforce the learning of the volume model.

Returning to decision block 82, if, however, the volume setting is not to be adapted, the controller determines whether a user-adjustment to the volume control has been received within a period of time from when the volume model decided not to adapt the volume setting (at decision block 88). In particular, the controller is determining whether the decision to not change the volume setting is the most optimal for the user. If a user-adjustment is received, indicating that the model should have adapted the volume setting, the controller 24 proceeds to block 85. If, however, no user-adjustment has been received, meaning that the most optimal action was to not change the volume, the controller proceeds to block 87.

As described herein, the model may be updated when user feedback, in the form of user-adjustments to the volume control, are received within a period of time. In another aspect, the model may be updated regardless of whether the user-adjustment is received within a period of time, as described herein. In one aspect, the model may be updated based on user feedback, so long as characteristics of the system 10 that were used by the volume model to decide whether the volume setting should be adapted remain (approximately) the same. As described in block 81, the model may make this decision based on the last environmental noise level. Once the volume setting is adapted (at block 83), the controller may determine whether a user-adjustment is received while the last environmental noise level remains (approximately) the same. If a user-adjustment is not received while the environmental noise has not changed, this may be used as positive feedback for the ML model, indicating that it made the most optimal choice, and the ML may be updated according to the positive feedback.

In one aspect, the model may be stored in memory 27 of the output device. For instance, the model may be retrieved (downloaded) from a remote device, such as a remote server, via a network (e.g., the Internet). As another example, the model may be stored in memory by the manufacturer, before leaving the factory. In one aspect, the controller 24 may receive multiple models, each model configured to adapt volume settings, as described herein. In particular, the controller may receive one type of model, such as the reinforcement learning model described herein, and may receive another type of model that may have a different framework than the model 32, such as being a supervised or unsupervised framework. In which case, the controller may be configured to execute both models, using at least some of the historical data 33 to generate an adapted volume setting as output. The controller 24 may monitor user feedback for a period of time to determine which model makes the most optimal decisions. Once that period of time has ended, the controller may select the model that has the highest percentage of correct decisions to be used for adapting the volume setting. For instance, during the period of time, the model 32 (first ML model) may continue to adapt volume settings, while a second ML model operates in the background. If the second ML model is determined to be more accurate, the controller may use the second ML model instead of the first model.

As described thus far, the feedback received by the controller may be "explicit" positive or negative feedback. In particular, the feedback may be explicit in that the model is being updated based on user action or inaction according to a decision being made by the ML model. In another aspect, the controller may use "implicit" feedback that indicates user behavior with respect to user context. In particular, implicit feedback may be user behavior with respect to context, as the user is using the output device 15. For example, implicit feedback may be data gathered and stored on the output device, as described herein, before the volume model may be stored and executed on the output device. As another example, the implicit feedback may be historical data gathered while the volume model is not running, such as while the model is deactivated, which may be based on a device setting of the output device.

Figure 9:
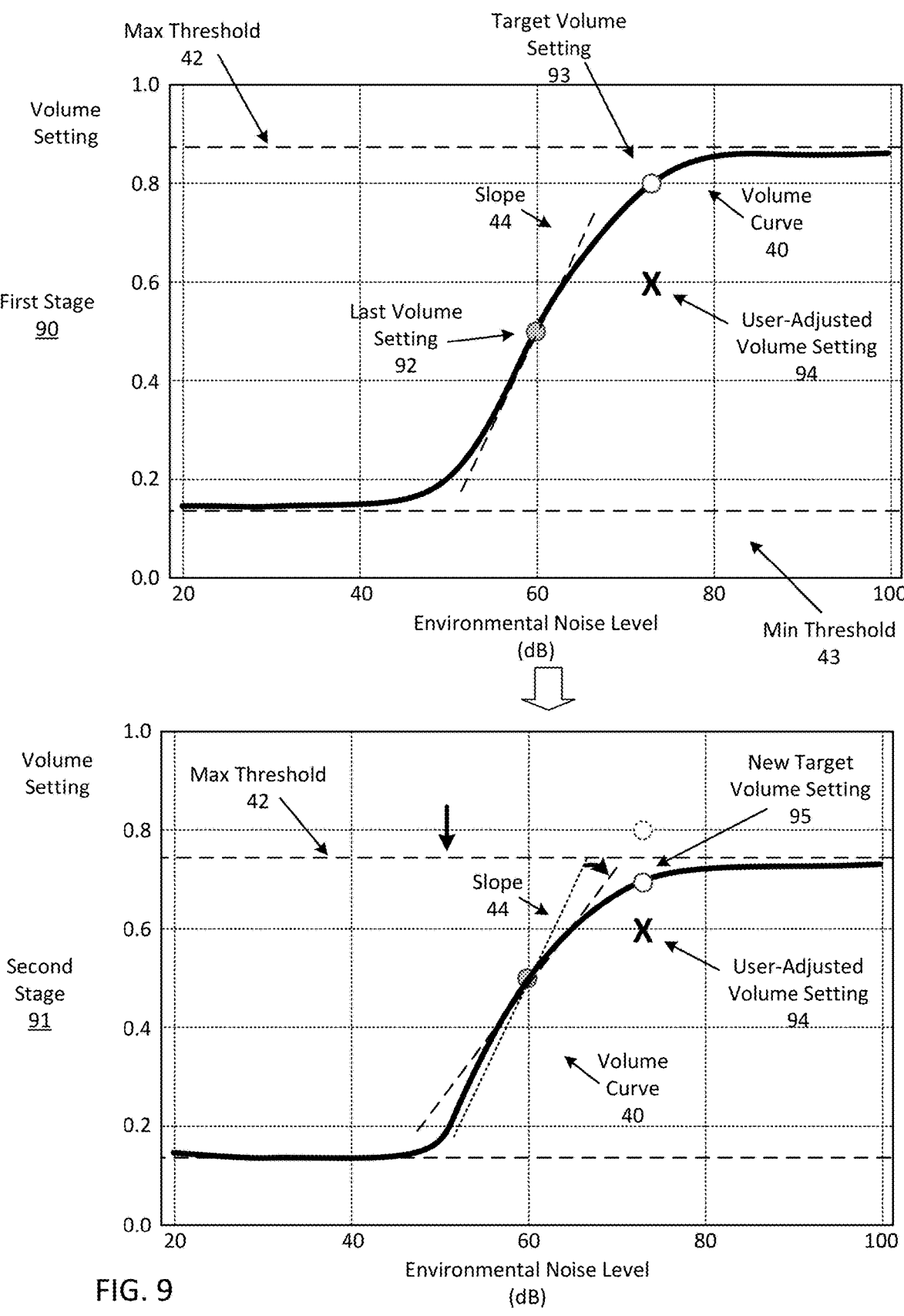
FIG. 9 shows several stages in which a volume curve that was personalized by the ML model is updated based on receiving a user-adjustment to the volume.

FIG. 9 shows two stages 90 and 91 in which the volume curve 40 of the ML volume model 32 is updated based on receiving a user-adjustment to the volume control. In particular, the first stage 90 shows the volume curve 40 that the ML model 32 used to determine a target volume setting 93, and the second stage 91 shows the volume curve 40 after it was updated based on a user-adjustment to the volume control 16. This figure shows a result of performing at least some operations in which a user-adjustment to the volume control 16 is received after the ML volume model 32 predicts and sets a target volume setting, and as a result the ML model updates (or adjusts) the volume curve.

The first stage 90 shows the curve 40 that is bounded by a max threshold 42 and a min threshold 43, with a slope 44. This stage shows the curve 40 having the same parameters as shown in FIG. 4, and that the last volume setting 92 is the previously target volume setting 41. At this time, however, the controller 24 determines that the environmental noise level has increased to approximately 73 dB. As a result, the model 32 predicted the target volume setting 93 to increase from the last volume setting 92 of 0.5 to 0.8. In one aspect, the controller may have adjusted playback of audio content by increasing the volume by ramping up the gain in order to increase the volume output to overcome the increase in the environmental noise. Once the volume level was set or prior to completion of the ramping, the user adjusted the volume setting, resulting in a user-adjusted volume setting 94 that is less than the target volume setting 93 by 20%. In one aspect, each volume setting may increase or decrease the volume by 20%. As a result, the user may have provided a single user-adjustment (e.g., one selection) of the volume-down input of the volume control 16, for example.

The second stage 91 shows the result of the user-adjustment. In particular, once the user-adjustment is received, the ML model identifies it as negative feedback, and performs an update in which the volume curve 40 is adjusted to compensate for the negative feedback. As shown, the max threshold 42 has been reduced from 0.88 to approximately 0.74, and the slope has rotated downward, such as by rotating about a Z-axis by 10°. As result, the new target volume setting 95 is 0.69, which is 0.11 less than the original target volume setting 93.

As shown, the curve 40 in the second stage 91 does not pass through the user-adjusted volume setting 94, but instead is between the target volume setting 93 and the setting 94. This may be due to the model taking into account historical data 33 that indicates that the user normally has a higher volume setting at this noise level. In another aspect, the volume curve may pass through the user-adjusted volume setting.

As described thus far, the adaptive volume control operations may be performed by the controller 24 of the output device. In one aspect, at least some of the operations may be performed (e.g., by the controller 20 of) the source device 14. For example, the source device may be configured to apply the volume adjustment (e.g., via an application of one or more scalar gains). This may be the case when the source device is streaming the audio content to the output device for playback. In which case, the output device may be configured to provide the adapted volume setting and the ramp rate to the source device, which may be configured to perform the ramping operations and the gain application upon one or more audio signals, as described with respect to ramp 36 and scalar gain 37. The source device may transmit one or more gain-adjusted audio signals to the output device, which may be used to drive the speaker 26. An example of the source device performing at least some of these operations is described with respect to FIG. 10.

Figure 10:
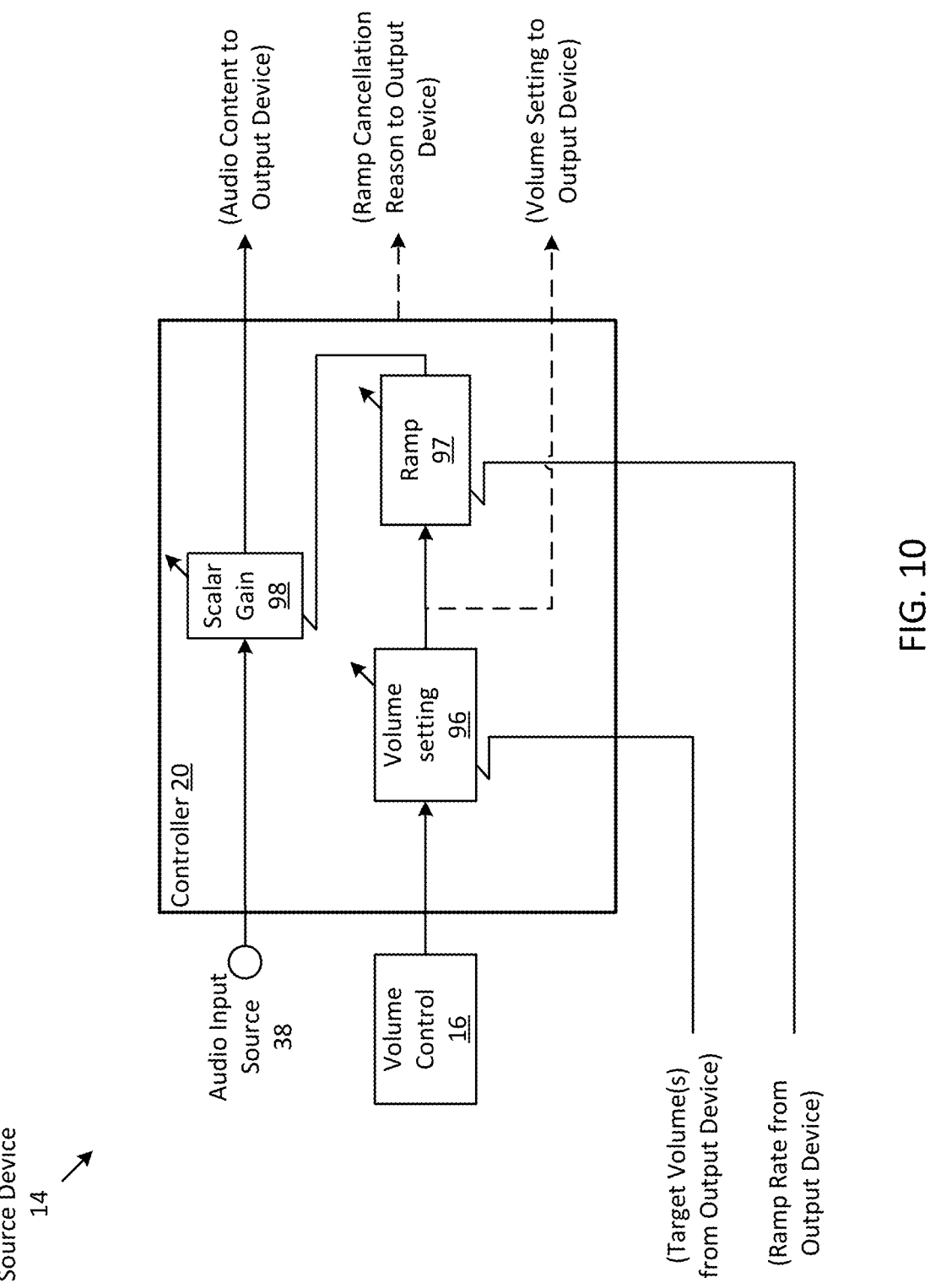
FIG. 10 shows a block diagram of the source device that performs contextual volume control operations according to one aspect.

FIG. 10 shows a block diagram of the source device 14 that performs one or more contextual volume control operations according to one aspect. As described thus far, the output device 15 may be configured to perform contextual volume control operations upon audio content, which may be received from an input audio source 132. In particular, the controller 24 of the output device may generate a target volume setting and may adjust a volume level of one or more audio signals received from the input audio source according to the target volume setting. In one aspect, this may be the case when the output device includes a hardware volume control in which the output device includes circuitry capable of adjusting the volume level of the audio content. In another aspect, the source device 14 may be configured to adjust the volume level according to a user-set or a model-set target volume setting, which may be the case when the source device includes a software volume control, and may be configured to cause the source device to transmit the volume-adjusted audio content to the output device for playback. In particular, the controller 20 may receive an audio signal that includes the audio content from the audio input source 132. The scalar gain 98 may receive the audio signal and produce a gain-adjusted audio signal by applying a scalar gain to the audio signal based on a volume setting 96 of the (e.g., volume control 16 of the) source device. The source device 14 may then transmit the gain-adjusted audio signal to the output device for playback. In one aspect, the applied gain may be based on a volume setting that may be set by the user via the volume control 16. In another aspect, the audio content may be adjusted based on a target volume setting that is received from the output device. A description of that is as follows.

As shown, the controller 20 of the source device includes the input audio source 132 and the controller 20, which includes a volume setting 96, a ramp 97, and a scalar gain 98. In one aspect, the controller may include other operational blocks, described herein. As shown, the source device 14 receives one or more target volume settings from the output device 15 and receives a ramp rate from the output device 15. In one aspect, the source device may receive this data once the output device performs contextual adaptive volume control operations to generate the ramp rate and target volume(s), responsive to a change in the environment, as described herein. For instance, the output device may determine the ramp rate (e.g., retrieving the rate from memory), and transmit the ramp rate and the target volume setting to the source device 14 in order for the source device to ramp up or down the output volume level of the audio content to a target output volume level of the target volume setting and to transmit the audio content, while being ramped up or down back to the output device for playback.

As described, the source device may receive one or more target volume settings. For example, the source device may receive different target volume settings based on different contexts, such as receiving different target volume settings for different types of audio content. In particular, the volume model of the output device may generate several target volume settings (e.g., in response to detecting a change in the environmental noise level) at least in part based on a context in which the user is using the headset, such as how the user is using the headset (e.g., listening to audio content) or environmental characteristics, as described herein. In particular, the source device may receive a target volume setting associated with the audio content that is currently being played back and other target volume settings for other types of audio content. As described herein, this may ensure that the most optimal target volume setting may be applied as the context changes (e.g., as the audio content changes from media content to telephony audio content).

In one aspect, the controller may be configured to select one of the received target volume settings based on the context in which the output device and/or the source device is being used by the user. For example, when the received target volume settings are for different types of audio content, the controller 20 may be configured to determine the content type of the audio content from the audio input source and may select a target volume setting of the received volume settings associated with that type. In one aspect, the controller 20 may store the target volume settings for later use, as described herein.

The volume setting 96 receives the target volume setting, which then provides the last volume setting and the target volume setting to the ramp 97. The ramp 97 receives the ramp rate (from the output device), and ramps up or down the scalar gain 98 that is applied to the audio content received from the input audio source 132 according to the ramp rate from a last gain that was applied according to the last volume setting to a new gain that is associated with the target volume setting. The source device 14 transmits the gain-adjusted audio content back to the output device for playback. In one aspect, the source device may transmit the audio content as its volume level is being ramped up or down by the scalar gain 98. For example, when the target volume setting is higher than the last volume setting, the audio content may be transmitted as the volume level of the audio content is being increased. As a result, the user of the output device may perceive the volume level of the audio content being played back by the output device increasing over the period of time associated with the ramp rate to (or ending at) the target volume level associated with the target volume setting.

In one aspect, the controller 20 may switch target volume settings based on changes to user context. For instance, the source device may receive user input, indicating a user-desire to playback different audio content. For example, the user may interact with a user interface (UI) displayed on the display 131 for the system 10 to playback a different type of audio content. As an example, the user may initiate a telephone call through a telephony application executing on the source device. As a result, the controller 20 may receive a downlink audio signal of the call. Thus, responsive to the user input, the controller 20 may receive another audio signal that includes telephony audio content, instead of media content, which may have been playing back before. The controller 20 may determine that the different audio content is of a different type, telephony instead of media, and may select a target volume setting from the received target volume settings that is associated with the different type. The source device may produce a gain-adjusted downlink audio signal by applying a gain based on the target volume setting, and may transmit the signal instead of the previous audio signal. As a result, the system may optimize the volume output to the user's preference, for different types of audio content.

As described in FIG. 6, in response to receiving a user-adjustment to a volume control while the volume output level is being ramped up or ramped down, the ramping may be canceled. For example, while gain is being increased or decreased at the ramp rate, the volume control 16 of the source device 14 may receive a user-adjustment. As a result, the ramp 97 may pause (or cancel) the ramping at a volume level associated with a current volume setting between the last volume setting and the target volume setting. In one aspect, the volume may be adjusted based on the user-adjustment. In particular, the ramping may be canceled such that the applied gain by the scalar gain is at a current applied gain at a moment along the ramp rate and when the user-adjustment was received. For example, the user-adjustment to the volume control may adjust the current volume setting at which the ramping was paused to a user-adjusted volume setting. In one aspect, the user-adjusted volume setting may be within a range of volume settings between the last volume setting, before the ramping occurred, and the target volume setting. In another aspect, the user-adjusted volume setting may be greater than either setting. In one aspect, the adjustment to the volume control may adjust the volume setting to the next adjacent volume setting in the sequence of volume setting associated with the volume control 16, as described herein. For example, if the volume setting was paused at a value of 5.5, where each volume setting is associated with an integer between 0 and 11, the adjusted volume setting may increase the volume setting to 6 or may decrease the volume setting to 5, depending on whether the adjustment is to increase or decrease the volume level. In response, the scalar gain 98 may be adjusted according to the user-adjusted volume setting by increasing or decreasing the gain. In one aspect, the user-adjustment may pause the ramping, while not increasing or decreasing the volume level. Thus, the source device may transmit the audio signal at the last output volume level associated with the last volume setting that was set by the ramp 97.

In one aspect, the source device may transmit data to the output device indicating that the ramping has been paused. For example, the source device may transmit a message to the output device that includes the current volume setting associated with a current applied gain, where the ramping stopped, to the output device and other data. In one aspect, the current volume setting may be the volume setting at which the ramping was paused, or may be the user-adjusted volume setting, as described herein. The source device may transmit a ramp cancellation reason to the output device. Returning to the previous example, the source device may transmit a message indicating that the ramping up or ramping down of the volume output level has been canceled based on a user-adjustment (e.g., to increase or decrease the volume level) to the volume control 16. In one aspect, the output device may use this data to update the volume model 32, as described herein. For instance, the volume model 32 may update one or more curve parameters, such as a curve slope of which the volume model used to generate the target volume setting. For example, the angle of the slope may increase, meaning that the updated model may predict a higher volume setting for a detected environmental noise level, than the pre-updated model for the same detected level.

Figure 11:
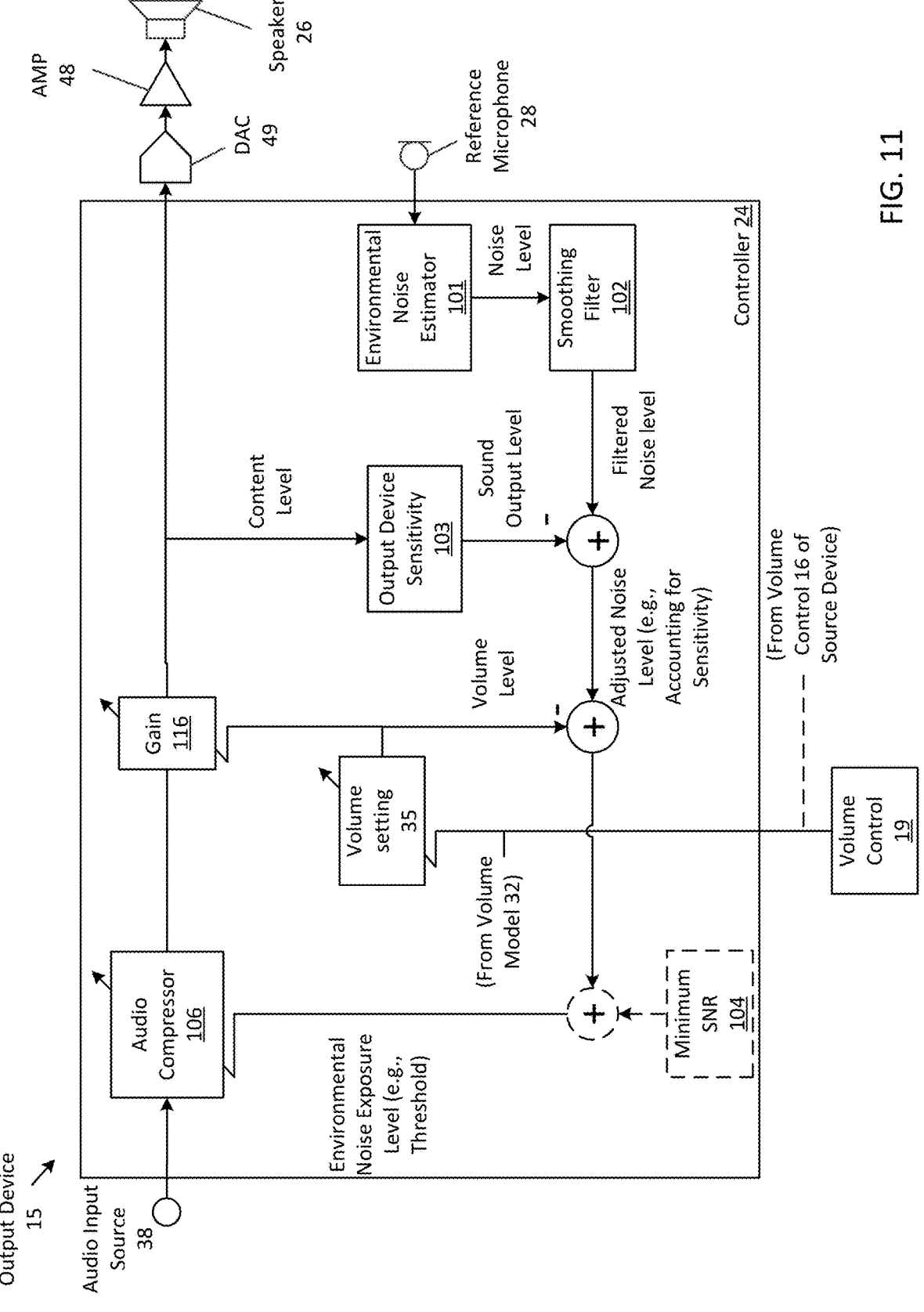
FIG. 11 shows a block diagram of the output device that performs dynamic range compression (DRC) operations upon audio content according to one aspect.

FIG. 11 shows a block diagram of the output device 15 that performs DRC operations according to one aspect. In particular, the controller 24 may be configured to perform audio compression operations and/or contextual adaptive volume control operations, as described herein. In one aspect, the controller 24 may perform at least some of these operations, while playing back audio content. For instance, the controller may receive audio content from the input audio source 132, may apply compression upon the audio content, and may apply a scalar gain 116 based on the volume setting 35 that indicates the volume level (e.g., dB or dBFS) of the system. In one aspect, the scalar gain 116 may be the same as the scalar gain 37.

As described herein, the volume setting 35 may be adapted by (received from) the volume model 32 or may be manually adjusted by the user through the volume control 19 of the output device 15 (or through the volume control 16 of the source device 14). For example, the model 32 may determine the volume level at which the audio content is to be played back through the speaker 26, as an adapted volume setting that is provided to the setting 35. The setting 35 may adjust the scalar gain 116 based on the received setting. In one aspect, the controller may apply one or more gains across one or more frequencies (frequency bands) based on the setting 35. Otherwise, the volume setting 35 may be set based on a user-adjustment of a volume control.

As shown, the controller 24 of the output device 15 includes several operational blocks, such as an environmental noise estimator 101, a smoothing filter 102, an output device sensitivity 103, an optional minimum SNR 104, an audio compressor (or compressor) 106, a volume setting 35, and a scalar gain 116. In one aspect, the controller 24 may include more or less operational blocks, such as including all (or most) of the blocks shown in FIG. 3. In another aspect, at least some blocks may be optional, such as the minimum SNR 104 and/or the smoothing filter 102. A description of the compression operations is as follows.

The environmental noise estimator 101 (which may be or perform at least some operations of the environmental/playback characteristic estimator 31 of FIG. 3) may be configured to receive a microphone signal that includes environmental noise captured by the reference microphone 28 and may be configured to determine a noise level of the noise from an environment in which the output device is located. In particular, the estimator 101 may be configured to determine the environmental noise level, as described herein. In one aspect, the noise level may be a LKFS value. In particular, the noise estimator 101 may collect one or more audio samples of the microphone signal and may produce a LKFS value based on the collected samples, as described herein. In particular, the noise estimator may have an update rate between 10 Hz to 40 Hz, or more preferably 20 Hz (thereby producing 20 LKFS samples per second). In another aspect, the noise level may be a sound pressure level (dB SPL) value or decibels A-weighted (dBA) value. In another aspect, the estimator 101 may be configured to determine the noise level based on the error microphone 29 of the output device. In particular, the noise level may include an aggregation of environmental noise and sound output of audio content that is being played back by the speaker 26. For instance, when the output device is an in-ear headset, the error microphone may capture sounds from within (or near) the user's ear drum. These sounds may include the audio playback and noise that leaks into the user's ear, for example through the coupling of the in-ear headset to the user's ear.

The smoothing filter 102 is configured to receive the noise level(s) estimated by the estimator 101 and is configured to smooth out the received noise levels. In particular, the filter may remove outlier noise levels (e.g., that are above a threshold), which may be due to sharp and abrupt noises captured by the microphone 28, such as a clap. In one aspect, the filter 102 may be a median (or average) filter that collects a group of noise level samples and outputs median noise level(s) (or median sample value(s)) as filtered noise level(s). In another aspect, the samples from the estimator 101 may be stored in a memory (e.g., in memory 27 of the output device) from which the filter 102 may produce one or more median sample values. In one aspect, the filter may store a finite amount of data (e.g., two seconds of data). In one aspect, the filter may use all or a portion of the stored samples to produce one or more median values. Once one or more median sample values are produced, the filter may capture additional data (e.g., another two seconds of data) and may then produce additional median noise level values, thereby periodically repeating the process.

In one aspect, the smoothing filter may include one or more parameters that may be set in order to ensure that any outlying median sample values that exceed the threshold are removed. For example, if audio samples captured from the microphone signal of the reference microphone 28 include high (e.g., higher than average) noise energy, the estimator 101 may produce a group of high noise level samples (e.g., above a threshold) over a period of time. As a result, median samples produced by the filter 102 may increase (e.g., beyond a threshold). As a result, the filter may apply an attack and release in order to ensure that the median sample values do not abruptly increase and/or decrease. In one aspect, the filter may have a first ramp rate for the attack and a second ramp rate for the release. Thus, changing median sample values may ramp up or ramp down based on the attack and release of the filter. In one aspect, the attack and release are predefined. In another aspect, they may be tunable (e.g., by a user of the output device).

As described herein, the volume or loudness of the audio content that is being played back is to be adjusted with respect to the environmental noise. In particular, the controller 24 may be configured to boost (or increase) the content level with respect to (or dependent upon) an estimated environmental noise level of the environment. To accomplish this, the controller may determine the (e.g., overall) environmental noise impact (or the environmental noise exposure level) on the user based on the audio content that is being played back. Thus, the controller may account for the content level of the audio content to determine the overall environmental noise impact.

In one aspect, the controller 24 may be configured to determine a noise exposure level by the user based on the volume level set by the volume setting 35, the content level of the audio content, and/or the estimated noise level. For instance, the controller may be configured to determine a sound output level of the output device based on the sensitivity of the (e.g., one or more speakers of the) output device. Sensitivity of the output device, such as an in-ear headset, indicates how efficiently the headset, such as the DAC 49, the AMP 48, the speaker 26, and/or the coupling to the user's ear while in an on-state, convert audio content into sound output. For example, the output device may include a sensitivity of 100 dB SPL at 0 LKFS, meaning that when the content level of the audio content is at its highest, 0 LKFS, the output device may produce a sound output level of (approximately) 100 dB SPL. To determine the sound output level, the controller may be configured to determine a sensitivity of the output device, which may be retrieved from memory 27 of the controller 24, or may be retrieved from a remote memory device. In particular, the memory may include a data structure that includes one or more sensitivities with respect to one or more output devices, or specifically characteristics, such as a unique identifier (e.g., serial number), of the output devices. In which case, the controller 24 may be configured to perform a table lookup into the data structure to select the sensitivity associated with the output device 15 (e.g., using a unique identifier associated with the output device).

With the sensitivity, the controller may determine the content level of the audio content that is being played back. In one aspect, the content level may be a LKFS value, such as −20 LKFS or −24 LKFS. In one aspect, the content level may be measured (e.g., over a period of time) by the controller, or may be determined based on metadata associated with the audio content. The output device sensitivity 103 block receives the content level (and the sensitivity of the output device), and determines a sound output level (e.g., in dB) of the output device based on the sensitivity of the output device and the content level. Returning to the previous example, when the sensitivity of the output device is 100 dB at 0 LKFS and the current content level of the audio content is −20 LKFS, the sound output level may be 80 dB (e.g., 100-20). The controller may produce an adjusted noise level that accounts for the sensitivity of the output device by subtracting the sound output level, which in this case may be 80 dB, from the filtered noise level from the filter 102.

Along with taking into account the content level, the controller 24 may be configured to take into account the volume level set by the volume setting 35 to produce the environmental noise exposure level by the user. Specifically, the controller may determine the exposure level by subtracting the volume level from the adjusted noise level. In one aspect, the resulting environmental noise exposure level may be a LKFS value, which may indicate the amount of environmental noise perceived by the user, which leaks into the user's ear through a coupling of the output device, for example, while playing back audio content through one or more speakers of the output device.

The compressor 106 may be configured to receive the environmental noise exposure level, and may be configured to determine (or produce) a threshold based on the environmental noise level. In one aspect, the threshold may be dependent on the noise exposure level. For instance, the compressor may set the threshold to the environmental noise exposure level. In another aspect, the compressor may set the threshold higher than the noise level. For example, the threshold may be a percentage higher, such as 10% higher than the environmental noise exposure level. As described herein, the threshold may be set higher based on user input.

The compressor may be configured to adjust the content level of the audio content based on the determined threshold. In particular, the compressor may perform one or more DRC operations such that the content level of the audio content does not drop below the threshold. For instance, the compressor 106 may determine whether a content level of the audio content is less than the threshold that may be based on the environmental noise exposure level, and responsive to determining that the content level is less than the threshold, the compressor may adjust the content level by applying one or more gains to the audio content such that the gain-adjusted content level of the audio content may be at least equal to the threshold. As a result, the compressor 106 may apply a first gain to the audio content based on the environmental noise exposure level, and the gain 116 may apply a second gain, subsequent to the first applied gain to the audio content based on the volume level set by the volume setting 35.

In one aspect, the compressor 106 may include an upwards compressor that may be configured to adjust the gain of the audio content based, when the content level of the audio content is less than the threshold. In which case, the upwards compressor may dynamically monitor the content level and the threshold, both of which may change over a period of time. For example, the upwards compressor may apply compression to one portion (e.g., a first portion) of the audio content. Upon receiving another portion (e.g., a second portion), subsequent to the first portion, the upwards compressor may determine that a content level of the second portion is greater than threshold. Such may be the case when the audio content is a movie soundtrack that moves from quiet dialog (the first portion) to a loud car chase (the second subsequent portion), for example. As a result of the increase in content level, the upwards compressor may cease applying the gain if the increased content level exceeds the threshold. As a result, the compressor 106 may dynamically ensure that the content provides at least the same impression at the user's ear as a current environmental noise. In which case, the audio content may be perceived over the environmental noise exposure of the user.

As described thus far, the compressor adjusts playback such that the sound output level of the audio content is at least equal to that of the noise exposure of the user. In another aspect, the controller 24 may be configured to increase the SNR of the audio content to ensure that it is louder than the environmental noise. In particular, the controller 24 may be configured to determine whether there is a minimum SNR for the content level of the audio content with respect to the noise exposure level, where the minimum SNR may be stored in memory. In which case, the minimum SNR 104 may be configured to add gain to the threshold, which may be based on the environmental noise exposure level, as described herein. For example, the SNR, such as 6 dB, may be added to the environmental noise exposure level value, which may then be used as the threshold by the compressor. Thus, the threshold may be a combination of the environmental noise exposure level and the minimum SNR. Therefore, as long as the minimum SNR is greater than zero, the content level of the audio content will be adjusted by the compressor to be greater than the environmental exposure level and as a result will be louder than the noise, as perceived by the user.

In one aspect, the minimum SNR 104 may be a predefined value, such as 6 dB. In another aspect, the SNR 104 may be a tunable value (e.g., through a user interface (UI) item displayed on a graphical user interface (GUI) displayed on the display 131 of the source device 14).

FIG. 12 shows three stages 110-112 of applying DRC upon audio content based on changes to the content level according to one aspect. In particular, each of the stages shows the compressor curve 107 of the compressor 106, and its impact on the content level of the audio content as the environmental noise level and content level change. Each stage shows the input content level of the audio content into the loudness compressor and its output content level, which may be boosted by the compressor based on the threshold 105. In one aspect, the threshold 105 may be the environmental noise exposure level or may be a combination of the exposure level and the minimum SNR 104, as described in FIG. 11.

The first stage 110 shows that the compressor is not applying upwards compression to the audio content because the threshold 105 is below the input level. Specifically, the threshold 105 is approximately −50 dB, while the input level is −30 dB. This may be due to the audio content being louder than the environmental noise exposure to the user. As a result, the output level of the audio content is the same as the input level, −30 dB.

The second stage 111 shows that the threshold 105 has increased, which may be due to the environmental noise becoming louder, such as the user moving from a quiet environment to a louder environment. As shown, the threshold has increased from −50 dB to −20 dB. As a result, the compressor has applied a (e.g., 10 dB) gain to the audio content to increase the output level of the content from −30 dB to −20 dB.

The third stage 112 shows that the input level of the audio content has dropped from −30 dB to −36 dB, which may be due to the audio content transitioning from a louder portion to a quieter portion (e.g., going from a car chase to quiet dialog, when the audio content is a movie soundtrack, as described herein). Since, however, the threshold 105 has remained the same, which may be due to the environmental noise remaining consistent between the second stage 111 and the third stage 112, the compressor may be configured to adjust the upwards compression to compensate for the lower input level. For instance, the compressor may apply more gain of 6 dB such that the output level remains the same as the threshold, at −20 dB, as the input level decreases.

FIG. 13 is a flowchart of one aspect of a process 120 for performing audio compression operations. In particular, the process 120 may be performed by the controller 24 of the output device to perform DRC upon audio content based on the environmental noise exposure level to a user of the output device. The process 120 begins with the controller 24 receiving audio content (at block 121). As described herein, the audio content may be received based on user input, such as by providing a user-request to a media player application to provide the audio content. In one aspect, the media player application may be executing on the source device 14. In which case, the source device may transmit the audio content via a wireless connection to the output device.

The controller 24 determines a content level of the audio content (at block 122). For instance, the controller 24 may perform a content analysis upon the audio signal that includes the audio content, and determine the content level. In one aspect, the content level may be a loudness measurement, such as a LKFS value. In particular, the LKFS value may be a loudness measurement across at least a portion of the audio content. In another aspect, the content level may be determined through metadata that may be received with the audio content. The controller 24 receives a volume level at which the audio content is to be played back through a speaker of the output device (at block 123). In particular, the controller may determine the volume level of the audio content that is to be (or is being) played back through the speaker 26 of the output device that may be worn by a user, when the output device is a headset for example. For instance, the volume level (e.g., in dB) may be defined by a volume setting 35 (e.g., a percentage or a value within a given range, as described herein) which may be set according to an adapted volume setting by the volume model 32 or may be set by the user via a user-adjustment to the volume control 19 (or via the volume control 16 of the source device). In which case, the volume setting may adjust the gain 116 that may be applied to one or more audio signals of audio content in order to set the volume level for the audio content. Specifically, the volume setting may output an indication of the volume level to the gain 116, which may adjust the applied gain according to the level.

The controller 24 determines a noise level of the environmental noise at the output device (at block 124). In particular, the controller may determine a noise level of noise of an acoustic environment in which the user is located. For instance, the environmental noise estimator 101 may receive a microphone signal that includes noise (and/or sounds produced by the output device) captured by the reference microphone 28, and produce one or more noise levels. In another aspect, the estimator 101 may determine the noise level via one or more microphones, such as from the error microphone 29 and/or the reference microphone 28. In addition, the controller 24 may perform smoothing filter operations to the noise level(s) produced by the estimator 101, via the smoothing filter 102.

The controller determines a noise exposure level by a user of the output device based on the volume level, the content level, and/or the noise level (at block 125). For example, when the output device is a headset, the controller may determine the noise exposure level by the user while wearing the headset based on one or more of the levels. In particular, the controller may determine the noise exposure level, while taking into account any sound produced by the output device. In other words, the controller may be configured to subtract the sound output of the output device from the captured noise by the microphone to determine the (actual) noise exposure perceived by the user. As described herein, the controller may subtract the sound output level from the noise level that may be determined based on the output device sensitivity 103 and the content level of the audio content. The controller may also subtract the volume level from the noise level. The resulting level may be the environmental noise exposure perceived by the user. In one aspect, the controller may account for the output device sensitivity without accounting for the volume level, which may be the case when the volume level is at a maximum (e.g., 0 dB).

The controller 24 optionally determines a minimum SNR for the output device (at block 126). In one aspect, the minimum SNR may be retrieved from memory of the output device. The controller determines whether the content level of the audio content is less than a threshold that is based on the noise exposure level (at decision block 127). In particular, the controller may determine whether the content level of the audio content is less than the environmental noise exposure level. For instance, the threshold may be set equal to the noise exposure level. If, however, the minimum SNR is above 0 dB, the threshold may be set to equal to a combination of the minimum SNR and the noise exposure level.

If so, the controller 24 adjusts the content level by applying a (first) gain to the audio content (at block 128). In particular, the compressor 106 may apply upwards compression to the audio content, such that the content level increases to at least the threshold. As a result, the controller may produce gain-adjusted audio content that includes a gain-adjusted content level that is at least equal to the environmental noise exposure level, as described herein. The controller 24 may apply a (second) gain to the audio content based on the volume level of the output device (at block 129). In this case, the gain 116 may apply a gain based on the volume level set by the volume setting 35. The controller 24 plays back the audio content through the speaker of the output device (at block 130). If, however, the content level is greater than the environmental noise exposure level, the controller may proceed to block 129.

In one aspect, the controller 24 of the output device may perform the audio compression operations. In another aspect, at least some of the operations may be performed by the source device 14. As described herein, the source device may be configured to adjust a volume of audio content and provide the volume-adjusted audio content to the output device for playback. In which case, the source device 14 may determine a volume level at which audio content is to be played back through a speaker of the output device. For example, the source device may receive, over a wireless connection with the output device for example, the target volume setting that may be produced by the volume model 32 on the output device 15 and/or may receive a volume setting based on a user-adjustment of the volume control of the output device, may apply the received volume setting to the audio content. In particular, the source device may apply a gain to the audio content based on the received volume setting in order to adjust the volume level of the audio content, as described herein. The source device may subsequently transmit, via the wireless connection, the volume-adjusted audio content to the output device for driving one or more speakers.

In which case, the controller 20 of the source device may be configured to perform at least some of the compression operations upon the audio content. For example, at least some of the operational blocks of FIG. 11 may be performed by the controller 20 of the source device 14, as shown in FIG. 10 for example. In particular, the controller 20 may be configured to determine a noise level of environmental noise at the headset. For instance, the source device may receive a microphone signal captured by a microphone (e.g., reference microphone 28) of the output device and may use the microphone signal to determine the noise level, as described herein. In another aspect, the source device may receive, over the wireless connection, the noise level from the headset (e.g., as a LKFS value, as described herein). In particular, the headset may determine the noise level and may transmit the noise level to the source device. In which case, the controller 20 may be configured to determine the noise exposure level by the user while wearing the output device based on the volume level and the noise level, as described herein. In another aspect, the output device may determine the noise exposure level, as described herein, and transmit that to the (controller 20 of the) source device 14. With the exposure level, the content level of the audio content, and the volume level, the controller 20 may perform compression, when needed. For instance, upon determining that the content level of the audio content is less than a threshold that is based on the noise exposure level, the controller 20 may apply DRC upon the audio content such that the content level is at least equal to the noise exposure level. The source device may transmit the audio compressed audio content to the output device for playback. In particular, the controller 20 of the source device may apply DRC upon one or more audio signals of the audio content, then apply a scalar gain to the one or more audio signals in order to adjust the volume level according to the (e.g., target) volume setting, and then transmit the audio signals to the output device for playback.

As described herein, the system 10 may perform contextual adaptive volume control operations responsive to receiving one or more user-adjustments to an input device, such as a volume control. Unlike the adaptive volume control operations described thus far, the system may perform the operations responsive to user input, as opposed to performing the operations without user intervention. This may have the benefit of allowing the user to maintain a consistent volume level, until the user wishes for the volume to change. In addition, the system may adapt the volume setting in response to minimal user intervention, such as a single-user adjustment of a volume control. This has several advantages. First, the system 10 may be configured to determine (predict) a user's desired volume setting, without the user needing to provide multiple volume adjustments. Second, such a system may reduce the need for a complex user interface, such as a touch-sensitive display screen that may be arranged to display a user-interface for adjusting the volume, such as a slider. Instead, an electronic device, such as an in-ear headset that may include one or more input devices, such as physical buttons, may perform the volume adaptations responsive to receiving a single user input via one of the input devices.

Figure 14:
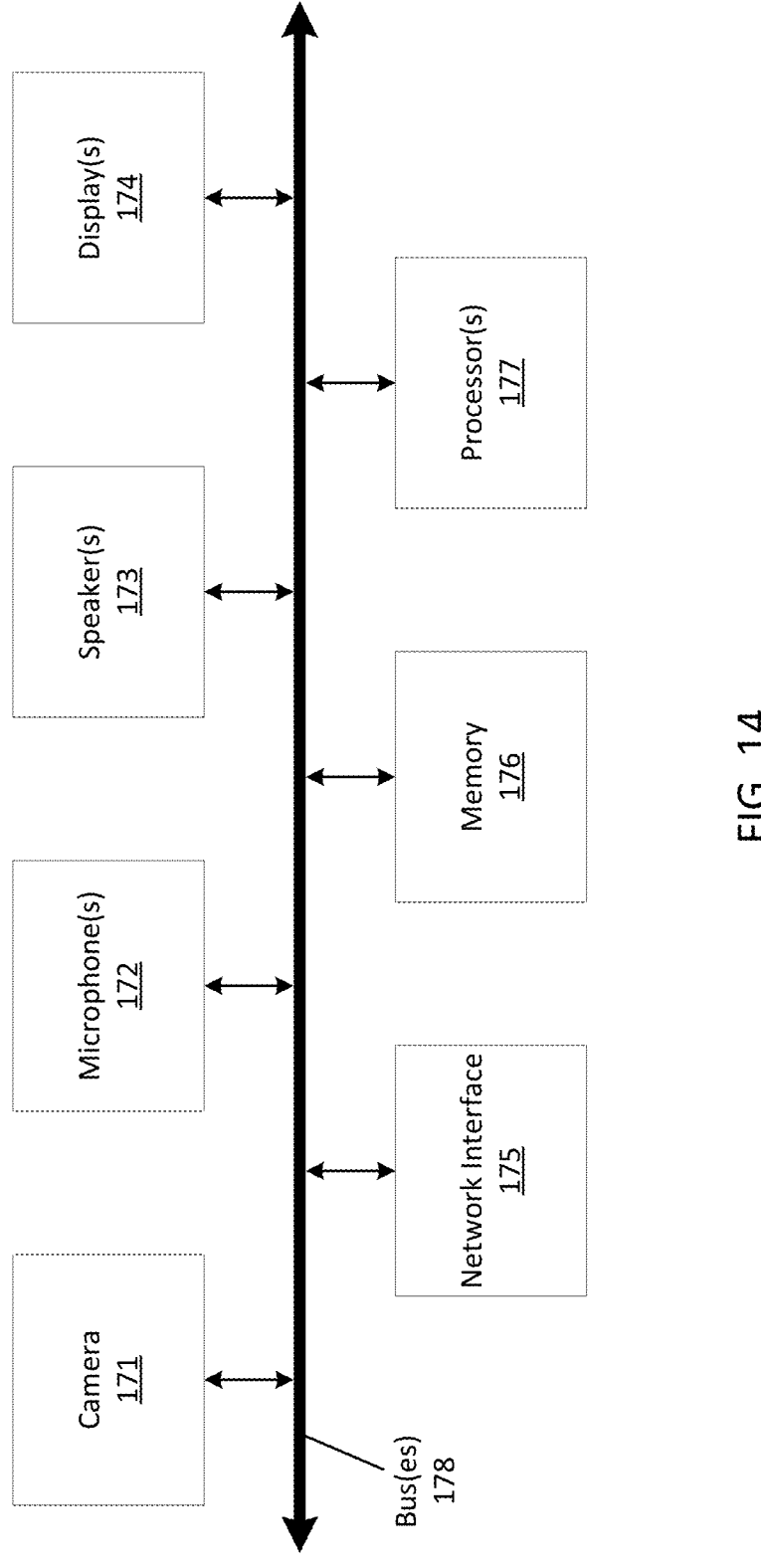
FIG. 14 illustrates an example of system hardware.

FIG. 14 shows a block diagram of audio processing system hardware, in one aspect, which may be used with any of the aspects described herein (e.g., media content server 13, source device 14, and/or output device 15). This audio processing system can represent a general-purpose computer system or a special purpose computer system. Note that while FIG. 14 illustrates the various components of an audio processing system that may be incorporated into one or more of the devices described herein, it is merely one example of a particular implementation and is merely to illustrate the types of components that may be present in the system. FIG. 14 is not intended to represent any particular architecture or manner of interconnecting the components as such details are not germane to the aspects herein. It will also be appreciated that other types of audio processing systems that have fewer components than shown or more components than shown in FIG. 14 can also be used. Accordingly, the processes described herein are not limited to use with the hardware and software of FIG. 14.

As shown in FIG. 14, the audio processing system (or system) 170 (for example, a laptop computer, a desktop computer, a mobile phone, a smart phone, a tablet computer, a smart speaker, a head mounted display (HMD), a headphone (headset), or an infotainment system for an automobile or other vehicle) includes one or more buses 178 that serve to interconnect the various components of the system. One or more processors 177 are coupled to bus 178 as is known in the art. The processor(s) may be microprocessors or special purpose processors, system on chip (SOC), a central processing unit, a graphics processing unit, a processor created through an Application Specific Integrated Circuit (ASIC), or combinations thereof. Memory 176 can include Read Only Memory (ROM), volatile memory, and non-volatile memory, or combinations thereof, coupled to the bus using techniques known in the art. Camera 171, microphone(s) 172, speaker(s) 173, and display(s) 174 may be coupled to the bus.

Memory 176 can be connected to the bus and can include DRAM, a hard disk drive or a flash memory or a magnetic optical drive or magnetic memory or an optical drive or other types of memory systems that maintain data even after power is removed from the system. In one aspect, the processor 177 retrieves computer program instructions stored in a machine-readable storage medium (memory) and executes those instructions to perform operations described herein.

Audio hardware, although not shown, can be coupled to the one or more buses 178 in order to receive audio signals to be processed and output (or played back) by speakers 173. Audio hardware can include digital to analog and/or analog to digital converters. Audio hardware can also include audio amplifiers and filters. The audio hardware can also interface with microphones 172 (e.g., microphone arrays) to receive audio signals (whether analog or digital), digitize them if necessary, and communicate the signals to the bus 178.

The network interface 175 may communicate with one or more remote devices and networks. For example, interface can communicate over known technologies such as Wi-Fi, 3G, 4G, 5G, Bluetooth, ZigBee, or other equivalent technologies. The interface can include wired or wireless transmitters and receivers that can communicate (e.g., receive and transmit data) with networked devices such as servers (e.g., the cloud) and/or other devices such as remote speakers and remote microphones.

It will be appreciated that the aspects disclosed herein can utilize memory that is remote from the system, such as a network storage device which is coupled to the audio processing system through a network interface such as a modem or Ethernet interface. The buses 178 can be connected to each other through various bridges, controllers and/or adapters as is well known in the art. In one aspect, one or more network device(s) can be coupled to the bus 178. The network device(s) can be wired network devices (e.g., Ethernet) or wireless network devices (e.g., WI-Fi, Bluetooth). In some aspects, various aspects described herein may be performed by a networked server in communication with one or more devices of the system 10.

Various aspects described herein may be embodied, at least in part, in software. That is, the techniques may be carried out in an audio processing system in response to its processor executing a sequence of instructions contained in a storage medium, such as a non-transitory machine-readable storage medium (e.g., DRAM or flash memory). In various aspects, hardwired circuitry may be used in combination with software instructions to implement the techniques described herein. Thus, the techniques are not limited to any specific combination of hardware circuitry and software, or to any particular source for the instructions executed by the audio processing system.

In the description, certain terminology is used to describe features of various aspects. For example, in certain situations, the terms "enhancer", "renderer", "estimator", "gain", "controller", "component," "unit," "module," "logic", "setting", "ramp", "model" "engine", "compressor" "filter", "SNR", "sensitivity", "generator", "optimizer", "processor", "mixer", "detector", "encoder" and "decoder" are representative of hardware and/or software configured to perform one or more processes or functions. For instance, examples of "hardware" include, but are not limited or restricted to an integrated circuit such as a processor (e.g., a digital signal processor, microprocessor, application specific integrated circuit, a micro-controller, etc.). Thus, different combinations of hardware and/or software can be implemented to perform the processes or functions described by the above terms, as understood by one skilled in the art. Of course, the hardware may be alternatively implemented as a finite state machine or even combinatorial logic. An example of "software" includes executable code in the form of an application, an applet, a routine or even a series of instructions. As mentioned above, the software may be stored in any type of machine-readable medium.

Some portions of the preceding detailed descriptions have been presented in terms of algorithms and symbolic representations of operations on data bits within a computer memory. These algorithmic descriptions and representations are the ways used by those skilled in the audio processing arts to most effectively convey the substance of their work to others skilled in the art. An algorithm is here, and generally, conceived to be a self-consistent sequence of operations leading to a desired result. The operations are those requiring physical manipulations of physical quantities. It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of an audio processing system, or similar electronic device, that manipulates and transforms data represented as physical (electronic) quantities within the system's registers and memories into other data similarly represented as physical quantities within the system memories or registers or other such information storage, transmission or display devices.

The processes and blocks described herein are not limited to the specific examples described and are not limited to the specific orders used as examples herein. Rather, any of the processing blocks may be re-ordered, combined, or removed, performed in parallel or in serial, as necessary, to achieve the results set forth above. The processing blocks associated with implementing the audio processing system may be performed by one or more programmable processors executing one or more computer programs stored on a non-transitory computer readable storage medium to perform the functions of the system. All or part of the audio processing system may be implemented as special purpose logic circuitry (e.g., an FPGA (field-programmable gate array) and/or an ASIC (application-specific integrated circuit)). All or part of the audio system may be implemented using electronic hardware circuitry that include electronic devices such as, for example, at least one of a processor, a memory, a programmable logic device or a logic gate. Further, processes can be implemented in any combination of hardware devices and software components.

As previously explained, an aspect of the disclosure may be a non-transitory machine-readable medium (such as microelectronic memory) having stored thereon instructions, which program one or more data processing components (generically referred to here as a "processor") to perform contextual adaptive volume control operations, digital signal processing operations, volume modeling, characteristic estimation operations, audio compression operations, rendering operations, network operations, and audio signal processing operations, as described herein. In other aspects, some of these operations might be performed by specific hardware components that contain hardwired logic. Those operations might alternatively be performed by any combination of programmed data processing components and fixed hardwired circuit components.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

As described herein, one aspect of the present technology is the gathering and use of data available from specific and legitimate sources to perform audio compression operations and/or contextual adaptive volume control operations to compensate for changes in content level of audio playback. The present disclosure contemplates that in some instances, this gathered data may include personal information data that uniquely identifies or can be used to identify a specific person. Such personal information data can include demographic data, location-based data, online identifiers, telephone numbers, email addresses, home addresses, data or records relating to a user's health or level of fitness (e.g., vital signs measurements, medication information, exercise information), date of birth, or any other personal information.

The present disclosure recognizes that the use of such personal information data, in the present technology, can be used to the benefit of users. For example, personal information data such as historical data may be used to automatically adapt volume control in order to provide a user with an overall better listening experience based on changes to the user's environment and/or audio content. Accordingly, use of such personal information data enables the performance of adaptive volume that compensates a volume level during playback based on the context in which the user is listening to the content.

The present disclosure contemplates that those entities responsible for the collection, analysis, disclosure, transfer, storage, or other use of such personal information data will comply with well-established privacy policies and/or privacy practices. In particular, such entities would be expected to implement and consistently apply privacy practices that are generally recognized as meeting or exceeding industry or governmental requirements for maintaining the privacy of users. Such information regarding the use of personal data should be prominent and easily accessible by users, and should be updated as the collection and/or use of data changes. Personal information from users should be collected for legitimate uses only. Further, such collection/sharing should occur only after receiving the consent of the users or other legitimate basis specified in applicable law. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations that may serve to impose a higher standard. For instance, in the US, collection of or access to certain health data may be governed by federal and/or state laws, such as the Health Insurance Portability and Accountability Act (HIPAA); whereas health data in other countries may be subject to other regulations and policies and should be handled accordingly.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data. In another example, users can select not to provide data such as volume levels and other data that may indicate the context in which the user is listening to audio content. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users based on aggregated non-personal information data or a bare minimum amount of personal information, such as the content being handled only on the user's device or other non-personal information available to the content delivery services.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:
1. A method comprising:
    receiving audio content;
    receiving a volume level at which the audio content is to be played back through a speaker of a headset that is worn by a user;

determining a sensitivity of the headset;

determining a sound output level of the headset based on the sensitivity of the headset and a content level of the audio content;

determining a noise level of environmental noise at the headset;

producing an adjusted noise level based on the sound output level and the noise level;

determining a noise exposure level by the user based on the volume level and the adjusted noise level;

determining whether the content level of the audio content is less than a threshold dependent on the noise exposure level; and responsive to determining that the content level is less than the threshold, adjusting the content level by applying a gain to the audio content such that a gain-adjusted content level of the audio content is at least equal to the noise exposure level.

2. The method of claim 1, wherein producing the adjusted noise level comprises subtracting the sound output level from the noise level.

3. The method of claim 2, wherein determining the noise exposure level further comprises subtracting the volume level from the adjusted noise level.

4. The method of claim 1, wherein the content level is a first content level of a first portion of the audio content, wherein the method further comprises:

receiving a second portion, subsequent to the first portion, of the audio content;

determining that a second content level of the second portion is greater than the noise exposure level; and ceasing to apply the gain.

5. The method of claim 1, wherein adjusting the content level comprises applying upwards compression to the audio content.

6. The method of claim 5 further comprising determining the threshold as a compression threshold of the upwards compression based on the noise exposure level, wherein the upwards compression is applied responsive to the content level being less than the compression threshold.

7. The method of claim 6 further comprising determining a minimum signal-to-noise ratio (SNR) of the content level with respect to the noise exposure level, wherein the compression threshold is a combination of the noise exposure level and the minimum SNR.

8. An electronic device, comprising:

at least one processor; and memory having instructions stored therein which when executed by the at least one processor causes the electronic device to:

determine a volume level at which audio content is to be played back through a speaker of a headset that is to be worn by a user;

determine a sound output level of the headset based on a sensitivity of the headset and a content level of the audio content;

determine a noise level of environmental noise at the headset;

produce an adjusted noise level based on the sound output level and the noise level;

determine a noise exposure level by the user while wearing the headset based on the volume level and the adjusted noise level;

determine whether a content level of the audio content is less than a threshold that is based on the noise exposure level; and responsive to the content level being less than the noise exposure level, apply audio compression upon the audio content such that the content level is at least equal to the noise exposure level.

9. The electronic device of claim 8, wherein the instructions to determine the noise level comprises instructions to receive, over a wireless connection, the noise level from the headset.

10. The electronic device of claim 8, wherein the memory has further instructions to receive, over a wireless connection, a volume setting of the headset, wherein the volume level is determined according to the volume setting, wherein the volume setting is produced by the headset based on a user-adjustment of a volume control of the headset or a volume machine learning model that outputs the volume setting responsive to the noise level as input.

11. The electronic device of claim 8, wherein the instructions to apply the audio compression comprises instructions to produce a gain-adjusted audio signal by applying one or more gains to an audio signal of the audio content, wherein the memory has further instructions to transmit, over a wireless connection, the gain-adjusted audio signal to the headset to drive the speaker of the headset.

12. The electronic device of claim 8, wherein the instructions to produce the adjusted noise level comprises instructions to subtract the sound output level from the noise level, wherein the instructions to determine the noise exposure level comprises instructions to subtract the volume level from the adjusted noise level.

13. The electronic device of claim 8 comprises a portable electronic device that is in wireless communication with the headset.

14. The electronic device of claim 13, wherein the portable electronic device comprises a smartphone, a laptop computer, or a smartwatch.

15. A non-transitory machine-readable medium having instructions which when executed by at least one processor of an output device, causes the output device to:

receive audio content;

receive a volume level at which the audio content is to be played back through a speaker of the output device;

determine a sensitivity of the output device;

determine a sound output level of the output device based on the sensitivity and a content level of the audio content;

determine a noise level of environmental noise;

produce an adjusted noise level based on the sound output level and the noise level;

determine a noise exposure level by a user of the output device based on at least one of the volume level and the adjusted noise level;

determine whether the content level of the audio content is less than a threshold based on the noise exposure level; and responsive to a determination that the content level is less than the threshold, apply audio compression upon the audio content such that the content level of the audio content is at least equal to the noise exposure level.

16. The non-transitory machine-readable medium of claim 15, wherein the instructions to produce the adjusted noise level comprises instructions to subtract the sound output level from the noise level.

17. The non-transitory machine-readable medium of claim 16, wherein the instructions to determine the noise exposure level comprises instructions to subtract the volume level from the adjusted noise level.

18. The non-transitory machine-readable medium of claim 15 comprises further instructions to determine the threshold as a compression threshold based on the noise exposure level, wherein the audio compression is applied responsive to the content level being less than the compression threshold.

19. The non-transitory machine-readable medium of claim 18 comprises further instructions to determine a minimum signal-to-noise ratio (SNR) of the content level, wherein the compression threshold is a combination of the noise exposure level and the minimum SNR.

20. The non-transitory machine-readable medium of claim 15, wherein the instructions to receive the noise level comprises instructions to:

receive a plurality of noise levels, each a loudness, k-weighted, full-scale (LKFS) value, wherein the non-transitory machine-readable medium; and apply a smoothing filter to the plurality of noise levels to filter out one or more outlier LKFS values.

* * * * *